(12) United States Patent
Sumiyama et al.

(10) Patent No.: US 8,038,306 B2
(45) Date of Patent: Oct. 18, 2011

(54) LIGHT SOURCE DEVICE AND IMAGE DISPLAY DEVICE HAVING A WAVELENGTH SELECTIVE ELEMENT

(75) Inventors: Fumika Sumiyama, Matsumoto (JP); Takashi Takeda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/024,052

(22) Filed: Feb. 9, 2011

(65) Prior Publication Data

US 2011/0128734 A1    Jun. 2, 2011

Related U.S. Application Data

(62) Division of application No. 11/892,910, filed on Aug. 28, 2007, now Pat. No. 7,905,608.

(30) Foreign Application Priority Data

Aug. 31, 2006  (JP) .................................. 2006-236374
Jun. 29, 2007  (JP) .................................. 2007-172205

(51) Int. Cl.
G03B 21/20    (2006.01)
G03B 21/16    (2006.01)

(52) U.S. Cl. ........................................... 353/85; 353/52

(58) Field of Classification Search ..................... 353/52, 353/85, 94, 122; 372/20–22, 50.22, 99, 100, 372/102; 359/326, 328
See application file for complete search history.

(56) References Cited

U.S. PATENT DOCUMENTS

| | | | |
|---|---|---|---|
| 5,193,023 A | 3/1993 | Yamada et al. | |
| 5,526,145 A | 6/1996 | Weber | |
| 5,859,945 A | 1/1999 | Kato et al. | |
| 6,192,170 B1 | 2/2001 | Komatsu | |
| 6,317,170 B1 | 11/2001 | Hwang et al. | |
| 6,323,987 B1 | 11/2001 | Rinaudo et al. | |
| 6,488,419 B2 | 12/2002 | Kato et al. | |
| 6,690,873 B2 | 2/2004 | Bendett et al. | |
| 6,947,459 B2 | 9/2005 | Kurtz et al. | |
| 7,376,168 B2 | 5/2008 | Mikhailov et al. | |
| 7,693,193 B2 * | 4/2010 | Kamijima | 372/22 |
| 2003/0034985 A1 | 2/2003 | Riddle et al. | |
| 2003/0133485 A1 | 7/2003 | Liu | |
| 2006/0023173 A1 | 2/2006 | Mooradian et al. | |
| 2006/0023757 A1 | 2/2006 | Mooradian et al. | |

(Continued)

FOREIGN PATENT DOCUMENTS

JP    A-63-137493    6/1988

(Continued)

OTHER PUBLICATIONS

Co-pending U.S. Appl. No. 12/189,858, filed Aug. 12, 2008.

(Continued)

*Primary Examiner* — Thanh X Luu

(74) *Attorney, Agent, or Firm* — Oliff & Berridge, PLC

(57) ABSTRACT

A light source device includes: a plurality of light emitting elements that emit laser light; and a wavelength selective element that includes a light selective region functioning as a resonator mirror of the light emitting element by selecting light of predetermined selective wavelength from the laser light emitted from one of the light emitting elements and reflecting the selected light toward the light emitting element while allowing the remaining laser light to pass therethrough, and a base member having a plurality of the light selective regions so that the wavelengths of the light selected by the light selective regions are different from each other.

6 Claims, 11 Drawing Sheets

U.S. PATENT DOCUMENTS

| | | |
|---|---|---|
| 2006/0082679 A1 | 4/2006 | Chua et al. |
| 2006/0165144 A1 | 7/2006 | Mikhailov et al. |
| 2006/0268241 A1 | 11/2006 | Watson et al. |
| 2006/0280219 A1 | 12/2006 | Shchegrov |
| 2007/0153862 A1 | 7/2007 | Shchegrov et al. |
| 2007/0153866 A1 | 7/2007 | Shchegrov et al. |

FOREIGN PATENT DOCUMENTS

| | | |
|---|---|---|
| JP | A 4-19719 | 1/1992 |
| JP | A-05-013862 | 1/1993 |
| JP | A-08-190111 | 7/1996 |
| JP | A-9-49948 | 2/1997 |
| JP | A-11-0878296 | 3/1999 |
| JP | A-11-233894 | 8/1999 |
| JP | A-2000-174397 | 6/2000 |
| JP | A-2001-15856 | 1/2001 |
| JP | A-2001-066718 | 3/2001 |
| JP | A-2001-189520 | 7/2001 |
| JP | A-2001-339118 | 12/2001 |
| JP | A-2002-232049 | 8/2002 |
| JP | A-2002-303904 | 10/2002 |
| JP | A-2003-158318 | 5/2003 |
| JP | A-2004-503923 | 2/2004 |
| JP | A 2004-144794 | 5/2004 |
| JP | A 2004-144936 | 5/2004 |
| JP | A-2005-537643 | 12/2005 |
| WO | WO 02/05038 A2 | 1/2002 |
| WO | WO 2006/105249 A2 | 10/2006 |
| WO | WO 2007/092710 A2 | 8/2007 |

OTHER PUBLICATIONS

Aram Mooradian et al., "High Power Extended Vertical Cavity Surface Emitting Diode Lasers and Arrays and Their Applications", Micro-Optics Conference, Tokyo, Nov. 2, 2005, pp. 1-4.

* cited by examiner

LIGHT SOURCE DEVICE AND IMAGE DISPLAY DEVICE HAVING A WAVELENGTH SELECTIVE ELEMENT

This is a Division of application Ser. No. 11/892,910 filed Aug. 28, 2007. The disclosure of the prior application is hereby incorporated by reference herein in its entirety.

CROSS-REFERENCE TO RELATED APPLICATION

This application claims priority from Japanese Patent Application No. 2006-236374, filed on Aug. 31, 2006, and Japanese Patent Application No. 2007-172205, filed on Jun. 29, 2007, the contents of which are incorporated herein by reference.

BACKGROUND

1. Technical Field

The present invention relates to a light source device and an image display device.

2. Related Art

Discharge lamps such as extra-high pressure mercury lamps are generally used as light sources in projection type image display device in recent years.

However, in such a discharge lamp, there are problems in that the service lifetime is short, instantaneous lighting is difficult, the color reproducibility range is narrow, and the ultraviolet rays emitted from the lamp may degrade the liquid crystal light valve.

As an alternative to this discharge lamp, a projection type image display device using a laser light source for emitting monochromatic light is proposed here.

However, while a laser light source does not have the problems mentioned above, the laser light source has the disadvantage that it has coherence.

As a result, interference band appears as speckle noise on the projection surface on which laser light is projected and the image deteriorates. Thus, measures against speckle noise are necessary if highly accurate images are to be displayed.

Devices in which dispersion elements are disposed on the projection surface or in an optical system projecting laser light on the projection surface, and devices that vibrate the dispersion elements are well known as devices for eliminating speckle noise.

For instance, an image display device including such a device is proposed in the Japanese Unexamined Patent Application, First Publication No. 2004-144936.

This image display device includes diffusion elements on the surface of which uneven portions of specific shape are formed.

These diffusion elements are made to vibrate at a predetermined frequency by an exciting device in the plane perpendicular to the optical axis, thereby changing the strength distribution of laser light incident onto the diffusion elements.

As a result, the speckle noise can be suppressed.

Moreover, a high output laser is necessary in the light source of a high intensity projector, and an array of light sources is used for high output.

For example, in the Japanese Unexamined Patent Application, First Publication No. 2004-144794, a method of controlling the temperature of the array of light sources is proposed as a measure against the speckle noise due to the array of light sources.

Each semiconductor laser in this array of light sources is maintained at a different temperature in this image display device. Each semiconductor laser emits luminous flux of varying wavelength depending on the difference in temperature.

In this way, by varying the output wavelength, the coherence of the semiconductor lasers can be reduced, and the speckle noise of the entire output source can be reduced.

The image display device disclosed in the Japanese Unexamined Patent Application, First Publication No. 2004-144936 has only one light source. If a plurality of light sources like an array of light sources is used, light is diffused by identical diffusion elements, so the coherence of light beams emitted from multiple light sources can not be reduced.

Also, to vibrate the diffusion elements, an exciting device is used. Therefore, the device on the whole increases in size, and noise due to vibration is generated.

The image display device disclosed in the Japanese Unexamined Patent Application, First Publication No. 2004-144794 is based on the prerequisite that a light source that does not require an external resonating structure, that is, a light source that outputs laser light directly, is used.

Evidently, the speckle noise can be effectively suppressed in case of a light source that does not require an external resonating structure.

Here, the basic configuration elements of a light source including external resonator are the light emitting element and wavelength selective element (resonator mirror).

Even if a plurality of light emitting elements is used, a wavelength selective element that selects a single wavelength is generally used considering the cost benefits and the ease of assembly.

For laser oscillation in the wavelength selective element, the band of the wavelength selected needs to be narrow.

The result is that even if the wavelength of each light beam emitted from an array of light sources is varied, as disclosed in the Japanese Unexamined Patent Application, First Publication No. 2004-144794, a single wavelength is selected by the wavelength selective element, and the coherence of the entire light source including wavelength selective element does not decrease.

SUMMARY

An advantage of some aspects of the invention is to provide a light source device, which is small in size, and in which it is possible to suppress speckle noise, to reduce the coherence of light beams, and to resolve the problems mentioned above. Also, an advantage of some aspects of the invention is to provide an image display device including the light source device.

A first aspect of the invention provides a light source device including: a plurality of light emitting elements that emit laser light; and a wavelength selective element that includes a light selective region functioning as a resonator mirror of the light emitting element by selecting light of determined selective wavelength from the laser light emitted from one of the light emitting elements and reflecting the selected light toward the light emitting element while allowing the remaining laser light to pass therethrough, and a base member having a plurality of the light selective regions so that the wavelengths of the light selected by the light selective regions are different from each other.

In the light source device related to the first aspect of the invention, in the wavelength selective element, a part of the light of predetermined selected wavelength emitted from the light emitting elements is reflected, oscillated and amplified between the resonator mirrors, while the remaining laser light passes through without amplification.

Some of the wavelengths of light that have passed through the wavelength selective elements from the selected wavelengths differ from other wavelengths and have been amplified. Therefore, the light intensity is extremely strong.

At this stage, in the light selective regions on the base member of the wavelength selective element, the wavelengths of the selected light are different from each other.

As a result, even if the peak wavelength of light emitted from the light emitting elements is the same, for example, the light emitted from the light emitting element has bandwidth; therefore light of different wavelengths is amplified and can be extracted from this bandwidth.

That is, when the light emitted from each light emitting element resonates in the light selective region of each of the wavelength selective element, the wavelength of light amplified in the resonator mirror structure emitted from each region differs.

That is, according to the invention, unlike the conventional item, since the wavelength selective element does not emit light of a single wavelength, the wavelength region of light passing through the wavelength selective element is assumed to spread over the entire region.

As a result, the coherence of amplified light beams emitted from each region of wavelength selective element reduces, and thus the speckle noise can be suppressed.

There is no need to provide diffusion elements or exciting devices for wavelength selective elements as in the past, therefore the entire device can be reduced in size.

The peak wavelength of light emitted from each light emitting element of the light emitting elements differs by a few nm because of manufacturing error.

In this case, the light emitted from the light emitting element can be efficiently extracted from the wavelength selective element by using the wavelength selective element that has the region selected by light of the same wavelength as the peak wavelength of each light emitting element.

That is, since wavelength selective element that could select only single wavelength was used in the past, variation occurred in the plane of the light emitted from the light source device.

However, according to the light source device of the invention, light can be passed through without any drop in the strength of the incident light because of the wavelength selective element; therefore, the light utilization efficiency can be improved.

It is preferable that the light source device of the first aspect of the invention further include a strain application section that applies strain to the light selective regions so as to vary the magnitude of the strain on the light selective regions and that varies the wavelengths of light selected by the light selective regions.

The light source device related to the first aspect of the invention, for example, a piezoelectric element may be used as the strain application section to apply strain to the light selective regions so as to vary the magnitude of the strain on the light selective regions.

As a result, the lattice spacing in the wavelength selective element varies, and the wavelength reflected in each region by the wavelength selective element differs.

Accordingly, when light emitted from the light emitting elements are reflected by the wavelength selective element and resonance is caused, the light amplified and emitted from each region will have different wavelengths.

Consequently, by using a simple configuration, the coherence of light beams passing through each region of the wavelength selective element reduces, costs can be reduced and speckle noise can be suppressed.

the strain application sections may be installed in the light selective regions, respectively.

In this configuration also, strain may be applied such that the wavelengths of light selected by the light selective regions are mutually different.

It is preferable that, in the light source device of the first aspect of the invention, the strain application sections be installed in the light selective regions, respectively.

In the light source device of the first aspect of the invention, by providing a strain application section in each light selective region, the strain applied in each region can be varied.

As a result, the lattice spacing within each region of the wavelength selective element can be adjusted.

Consequently, when variation exists in the light emitted from the light emitting element, the selective wavelength can be varied by region so as to match the wavelength of the light emitted from the light emitting element.

That is, the light utilization efficiency can be improved to enable the wavelength of light emitted from each light emitting element to be aligned with the selective wavelength of each region of the corresponding wavelength selective element.

It is preferable that the light source device of the first aspect of the invention further include a temperature variation section that varies the temperature of each light selective region and that varies the wavelengths of light selected by each light selective region.

The temperature variation section in the light source device related to the first aspect of the invention varies the temperature according to each light selective region of the wavelength selective element; therefore, the lattice spacing within the wavelength conversion element varies according to the temperature of each light selective region.

As a result, in the light selective regions of the wavelength selective element, the wavelengths of the selected light are different from each other.

Accordingly, light emitted from the light emitting elements is reflected at each light selective region of the wavelength selective element and becomes light in which the wavelength differs.

In this way, without applying any external force on the wavelength selective element and with only a change in the temperature of each light selective region, the periodic lattice spacing within the wavelength selective element changes.

As a result, the coherence of amplified light beams reflected from each region of wavelength selective element reduces with a simpler configuration, and thus the speckle noise can be suppressed.

Moreover, a plurality of temperature variation sections may be provided, and a temperature variation section may be provided for a set of multiple light selective regions.

In this configuration also, the temperature may be varied such that the wavelengths of light selected by the plurality of light selective regions are mutually different.

It is preferable that, in the light source device of the first aspect of the invention, the temperature variation sections be installed in the light selective regions, respectively.

In the light source device of the invention, by providing a temperature variation section in each light selective region, the temperature applied in each region can be varied.

As a result, the lattice spacing within each region can be adjusted.

Consequently, when variation exists in the light emitted from the light emitting element, the selective wavelength can be varied by region so as to match the wavelength of the light emitted from the light emitting element.

Accordingly, the wavelength of light emitted from each light emitting element and the selective wavelength of each region of the wavelength selective element can be aligned, and the light utilization efficiency can be improved.

It is preferable that, in the light source device of the first aspect of the invention, the wavelength selective element include a wavelength selective film, and the wavelengths of light selected by the light selective regions be different from each other by varying a thickness of the wavelength selective film in each of the light selective regions.

According to the light source device related to the first aspect of the invention, the thickness of thin film with varying refractive index formed on a substrate differs with the light selective region of the wavelength selective element; therefore, the wavelength of light selected for each light selective region will vary with the wavelength selective element.

Consequently, when the light emitted from the light emitting elements passes through the wavelength selective element, the wavelength of light emitted from each light selective region will differ.

That is, the wavelength selective element is formed by thin film of film thickness that suits the selective wavelength; therefore, there is no need to control the wavelength selective element such that the selective wavelength in each selective region of the wavelength selective element differs.

As a result, the coherence of amplified light beams reflected from each region of wavelength selective element reduces correctly with a simpler configuration, and thus the speckle noise can be suppressed.

A second aspect of the invention provides a light source device including: a plurality of light emitting elements that emit laser light; a wavelength conversion element that includes a light pass-through region through which the laser light emitted from one of the light emitting elements passes, which converts light of the wavelength included in the laser light into light of a predetermined wavelength, and which emits the light having been converted into the predetermined wavelength and light having not been converted into the predetermined wavelength, and that is constituted by a plurality of the light pass-through regions so that the wavelengths of the light converted by the light pass-through regions are different from each other; and a wavelength selective element that includes a light selective region into which the light having been converted into the predetermined wavelengths and the light having not been converted into the predetermined wavelengths are incident, functioning as a resonator mirror of the light emitting element by selecting the light having not been converted into the predetermined wavelengths and reflecting the light having not been converted into the predetermined wavelengths toward the light emitting element while allowing the remaining laser light to pass therethrough, and a base member having a plurality of the light selective regions so that the wavelengths of the light selected by the light selective regions are different from each other.

According to the light source device related to the second aspect of the invention, when laser light of green color is to be emitted, for example, a light source of wavelength 1060 nm is used, and a wavelength selective element that allows light of green color to pass through is used as the light emitting element.

As a result, the light emitted from the light emitting element passes through the wavelength conversion element, and is repeatedly reflected between the light emitting element and the wavelength selective element.

Subsequently, the laser light converted into green color is emitted from the wavelength selective element.

Thus light of the desired wavelength can be obtained from the wavelength conversion element, and light can be emitted with the speckle noise suppressed.

It is preferable that, in the light source device of the second aspect of the invention, the wavelength conversion element have a domain-repetitive structure in which polarization is repetitively reversed along the central axis of laser light emitted from the light emitting elements, and the wavelengths of light converted by the light pass-through regions be different from each other by varying a width in the direction of the central axis of the laser light of the domain for each of the light pass-through regions.

In the light source device of the invention, the wavelength of light converted for each light pass-through region of the wavelength conversion element differs because the polarization reversal period in the direction of the optical axis of the light passing through the wavelength conversion element differs for each light pass-through region of the wavelength conversion element.

Accordingly, when light emitted from the light emitting elements passes through a wavelength conversion element, the wavelength of light emitted from each light pass-through region will be different.

That is, the polarization period of each light pass-through region of a wavelength conversion element may be varied corresponding to the wavelength of light selected in each light selective region of the wavelength selective element. Thus, the wavelength of light converted in the wavelength conversion element can be easily aligned with the wavelength of light selected in the wavelength selective element.

As a result, a light source device in which speckle noise is suppressed can be attained while light utilization efficiency of light emitted from the light emitting elements can be improved by using a simple configuration.

It is preferable that the light source device of the second aspect of the invention further include a temperature variation section that varies the temperature of each the light pass-through region and that varies the wavelengths of light converted by each light pass-through region. In the light source device, the wavelength conversion element has a domain-repetitive structure in which polarization is repetitively reversed along the central axis of laser light emitted from the light emitting elements, and a width in the direction of the central axis of the laser light of the domain is equal in all the light pass-through regions.

In the light source device related to the second aspect of the invention, the polarization reversal period along the optical axis of light passing through each light pass-through region of the wavelength conversion element is the same.

However, since the temperature is varied for each light pass-through region of the wavelength conversion element by the temperature variation section, the refractive index corresponding to temperature varies for each light pass-through region.

As a result, the wavelength of light converted in each light pass-through region of the wavelength conversion element differs.

Accordingly, the wavelength of each light beam emitted from the light emitting elements and passing through each light pass-through region of the wavelength conversion element will differ.

In this way, by merely varying the temperature of each light selective region of the wavelength selective element, the internal structure of a wavelength selective element can be easily changed.

As a result, a light source device in which speckle noise is suppressed can be attained while light utilization efficiency of light emitted from the light emitting elements can be improved by using a simple configuration.

It is preferable that the light source device of the second aspect of the invention further include a voltage application section that applies voltage to the light pass-through regions so as to vary the voltage to the light pass-through regions and that varies the wavelengths of light converted by the light pass-through regions. In the light source device, the wavelength conversion element has a domain-repetitive structure in which polarization is repetitively reversed along the central axis of laser light emitted from the light emitting elements, and a width in the direction of the central axis of the laser light of the domain is equal in all the light pass-through regions.

In the light source device related to the second aspect of the invention, the refractive index will differ in each light pass-through region of the wavelength selective element by varying the applied voltage in the voltage application section of each light pass-through region of the wavelength selective element.

In this way, by varying the voltage applied on each light pass-through region of the wavelength conversion element, the wavelength of light converted in each light pass-through region of the wavelength conversion element can be made the same as the wavelength of light passing through each light selective region of the wavelength selective element corresponding to each region.

As a result, the wavelength of light converted in each light pass-through region of the wavelength conversion element can be made to differ.

Accordingly, a light source device that suppresses speckle noise can be attained while improving the light utilization efficiency of light emitted from the light emitting elements by a simpler configuration.

It is preferable that the light source device of the second aspect of the invention further include a strain application section that applies strain to the light selective regions so as to vary the magnitude of the strain on the light selective regions and that varies the wavelengths of light selected by the light selective regions.

According to the light source device related to the second aspect of the invention, effects similar to the effects when the strain application section mentioned above is provided, can be obtained.

It is preferable that, in the light source device of the second aspect of the invention, the strain application sections be installed in the light selective regions, respectively.

Also, according to the light source device related to the second aspect of the invention, effects similar to the effects obtained when the strain application sections mentioned above are provided, can be obtained.

It is preferable that the light source device of the second aspect of the invention further include a temperature variation section that varies the temperature of each light selective region and that varies the wavelengths of light selected by each light selective region.

Effects similar to those when provided with the above-mentioned temperature variation section can be attained in the light source device related to the invention.

It is preferable that, in the light source device of the second aspect of the invention, the temperature variation sections be installed in the light selective regions, respectively.

Effects similar to those obtained when the above-mentioned temperature variation sections are provided, can be obtained in the light source device related to the invention.

It is preferable that, in the light source device of the second aspect of the invention, the wavelength selective element include a wavelength selective film, and the wavelengths of light selected by the light selective regions be different from each other by varying a thickness of the wavelength selective film in each of the light selective regions.

Effects similar to those attained when the thickness of the above-mentioned wavelength selective film is different from each other can be obtained in the light source device related to the invention.

It is preferable that, in the light source device of the second aspect of the invention, a peak wavelength of light emitted from at least one of the light emitting elements be identical to a peak wavelength of light selected in the light selective region corresponding to the light selective region.

The wavelength of light converted in each light pass-through region of the wavelength conversion element is the same as the wavelength of light selected in each region of the corresponding wavelength selective element in the light source device related to the invention.

As a result, there is no reduction in the amount of each light beam converted in each region of the wavelength conversion element when passing through each light selective region of the corresponding wavelength selective element.

Consequently, by using a simple configuration, the light utilization efficiency of light emitted from the light emitting elements can be increased, and the coherence of light beams passing through each region of the wavelength selective element can be reduced; therefore, the speckle noise can be suppressed.

A third aspect of the invention provides an image display device including: the light source device of the first aspect or the second aspect of the invention; a light modulating device that modulates light emitted from the light source device in accordance with image signal; and a projection device that projects images formed by the light modulating device.

According to the image display device related to the third aspect of the invention, light emitted from the light source device is made incident on a light modulating device.

The image formed by the light modulating device is projected by the projection device.

At this stage, the light emitted from the light source device, is light with reduced coherence, as mentioned above. Therefore, the light projected by the projection device is light in which the speckle noise is suppressed.

Accordingly, a satisfactory image can be displayed.

A fourth aspect of the invention provides an image display device including: the light source device of the first aspect or the second aspect of the invention; and a scanning section that scans the laser light emitted from the light source device on a projection surface.

According to the image display device related to the invention, light emitted from the light source device is scanned by a scanning section.

The light scanned by the scanning section will be projected on the projection surface.

At this stage, the light emitted from the light source device is light with reduced coherence, as mentioned above. Therefore, the light projected on the projection surface on which it is to be projected is light in which the speckle noise is suppressed.

Accordingly, a satisfactory image without uneven brightness can be displayed.

DESCRIPTION OF EXEMPLARY EMBODIMENTS

Figure 1:
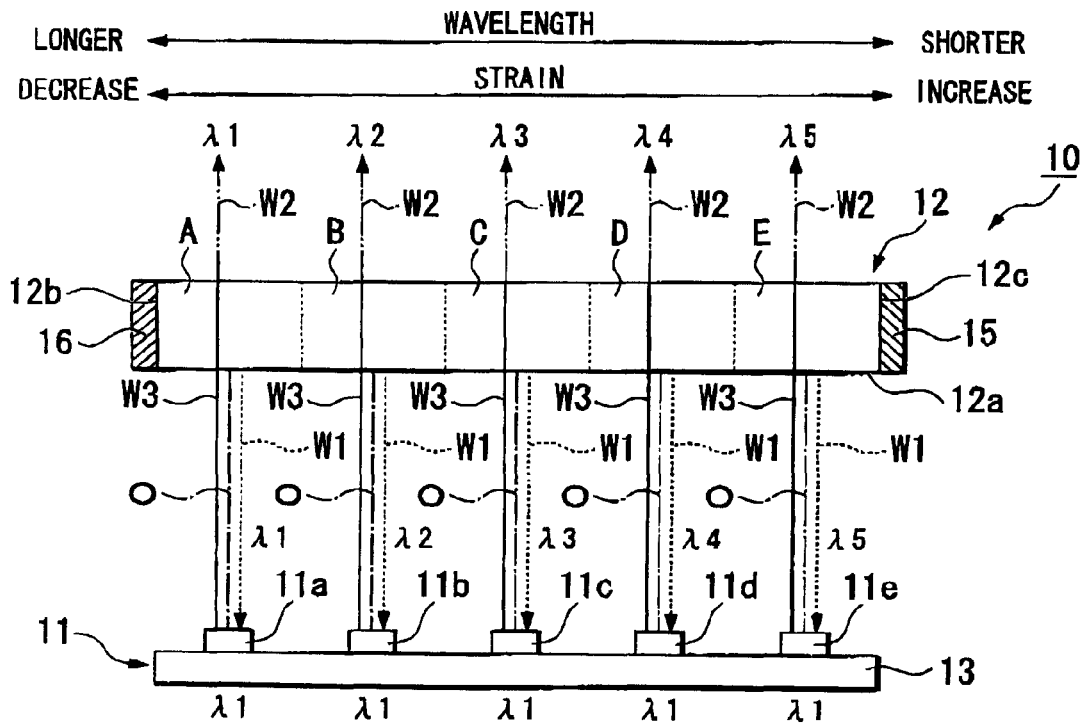
FIG. 1 is a plan view of the light source device related to a first embodiment of the invention.

The embodiments of the light source device and the image display device related to the invention are explained here referring to the drawings.

The scale of each member in the drawings below has been changed appropriately to sizes that enable each member to be recognized easily.

First Embodiment

Figure 2:
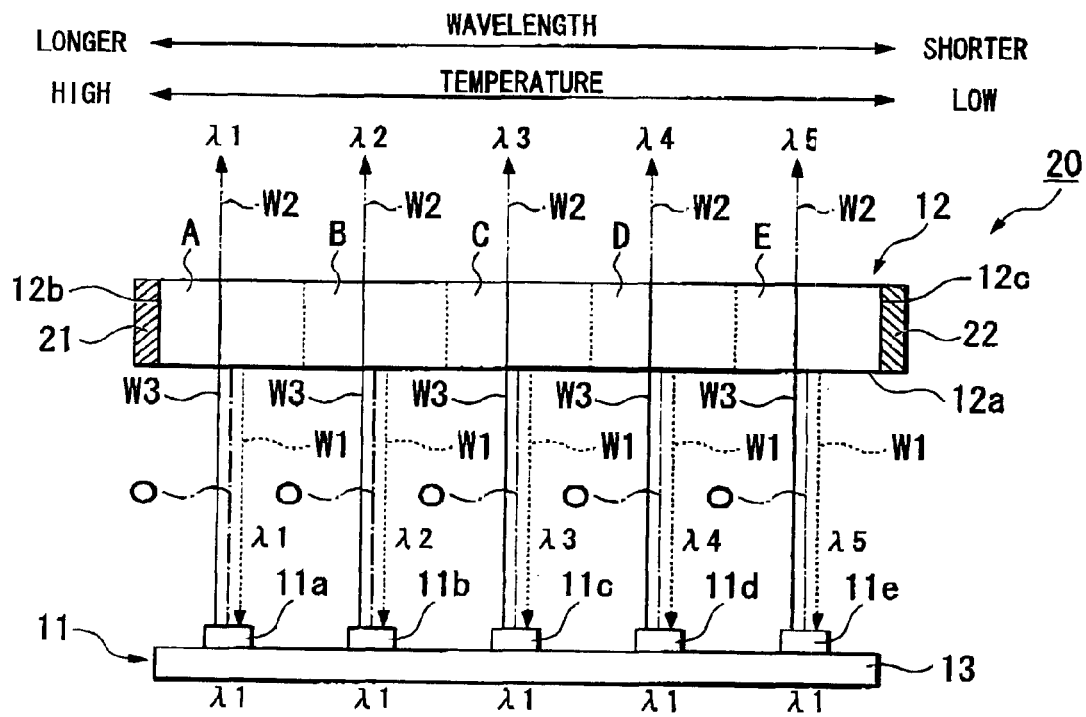
FIG. 2 is a plan view of the light source device related to a second embodiment of the invention.
Figure 3:
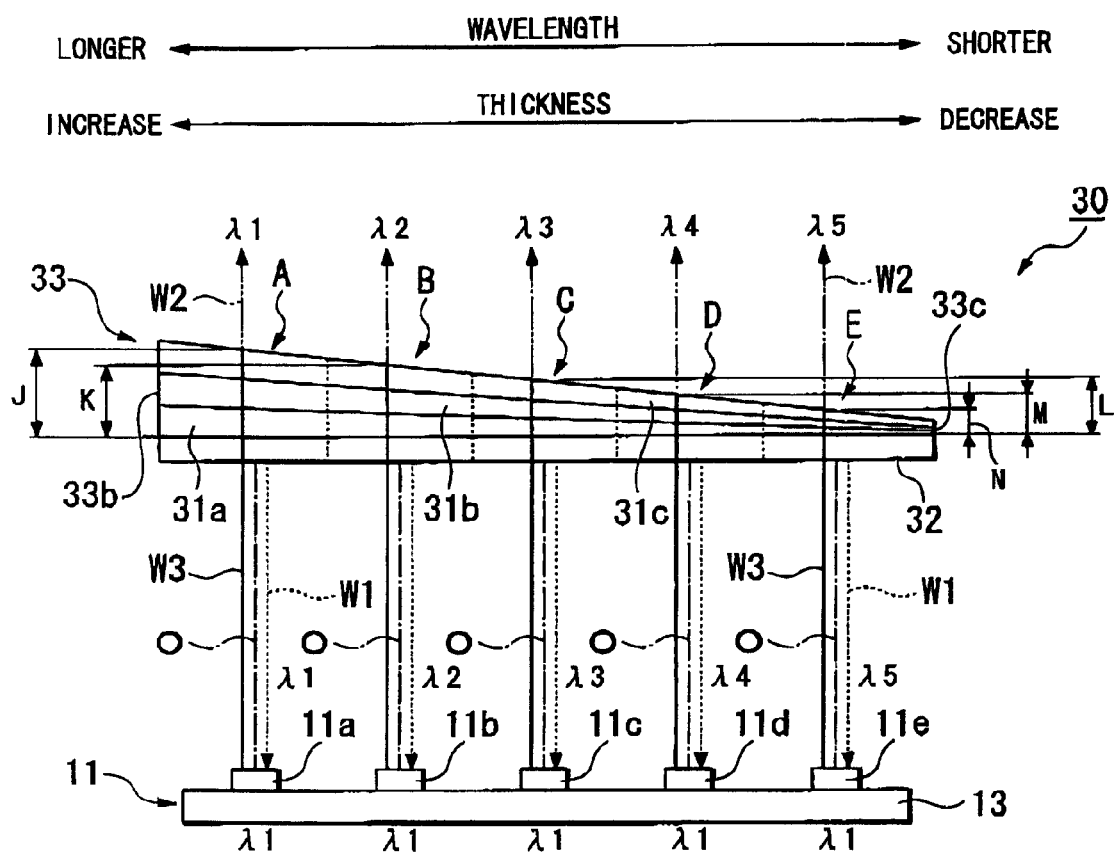
FIG. 3 is a plan view of the light source device related to a third embodiment of the invention.

The first embodiment of the invention is described hereafter referring to FIGS. 1 to 3.

The light source device 10 related to the first embodiment includes a light emitting section 11 and a wavelength selective element 12.

The light emitting section 11 includes five light emitting elements (semiconductor laser: LD) 11a, 11b, 11c, 11d, 11e that emit laser light.

Each of the light emitting elements 11a, 11b, 11c, 11d, and 11e is supported by a support member 13.

The peak wavelengths of light emitted from the light emitting elements 11a, 11b, 11c, 11d, and 11e substantially coincide.

However, the wavelengths may vary slightly, they need not necessarily coincide perfectly.

Generally, they may differ by a few nm because of manufacturing errors in the light emitting elements.

The wavelength selective element 12 selects a part of the light W1 of predetermined selective wavelength (approximately 98 to 99%) from the incident laser light (dotted line shown in FIG. 1) and reflects the laser light including the selective wavelength toward the light emitting section 11. Thus, the wavelength selective element 12 functions as a resonator mirror of the light emitting elements 11a, 11b, 11c, 11d, and 11e, and also allows the rest of the laser light (dashed and two-dotted line in FIG. 1) W2 to pass through.

As the wavelength selective element 12, an optical element such as a hologram having periodic lattices may used.

The light (solid line shown in FIG. 1) W3 of the fundamental harmonic emitted from the light emitting section 11 is repetitively reflected between the light emitting section 11 and the wavelength selective element 12. After amplification, the amplified light is emitted from the wavelength selective element 12 as laser light W2.

The wavelength selective element 12 passes through light of different wavelengths, but the wavelength selective element 12 amplifies light of only certain predetermined wavelengths.

The intensity of amplified light is extremely high compared to the intensity of light of other wavelengths.

Thus, the light W2 after passing through the wavelength selective element 12 can be generally treated as light of a single wavelength.

The wavelength of the light W2 is substantially the same as the selective wavelength of the wavelength selective element 12, that is, the wavelength of light W1 reflected by the wavelength selective element 12.

The wavelength selective element 12 reflects a part (approximately 98 to 99%) of the light of predetermined selective wavelength, and thus the remaining light (approximately 1 to 2%) will be used as output light.

As shown in FIG. 1, a piezoelectric element (strain application section) 15 is attached in contact with a first end face (end face on the side of region E mentioned hereafter) 12c perpendicular to the incident face 12a of the wavelength selective element 12 onto which the light emitted from the light emitting section 11 is incident.

As the piezoelectric element 15, piezoelectric ceramics and piezoelectric crystals such as crystal, lead titanate (PbTiO$_3$), lead zirconate (PbZrO$_3$), barium titanate (BaTiO$_3$) may be used.

An absorbing member 16 is provided on a second end face (end face on the side of the region A mentioned hereafter) 12b opposite to the first end face 12c of the wavelength selective element, as shown in FIG. 1.

The absorbing member 16 is fixed such that the absorbing member 16 cannot be moved.

The thickness in the longitudinal direction of the wavelength selective element 12 of the piezoelectric element 15 is approximately 0.1 mm.

However, this number is just an example. This number may vary depending on the material used for the piezoelectric element 15.

The piezoelectric element 15 is displaced when voltage is applied. Strain is caused in the wavelength selective element 12 as a result of this displacement.

The piezoelectric element 15 is installed on the first end face 12c of the wavelength selective element 12. The position of the absorbing member 16 is fixed.

Thus, the piezoelectric element 15 will pressurize in the direction from the piezoelectric element 15 to the absorbing member 16, that is in a direction perpendicular to the central axis (optical axis) O of the laser light emitted from each of the light emitting elements 11a, 11b, 11c, 11d, and 11e.

As a result, strain is generated in the wavelength selective element 12.

The magnitude of the strain is maximum on the side of the first end face 12c on which the piezoelectric element 15 is installed, and the magnitude of the strain gradually reduces on moving toward the side of the second end face 12b on which the absorbing member 16 is installed.

The selective wavelength of the wavelength selective element 12, that is, the wavelength of light W1 reflected by the wavelength selective element 12 varies corresponding to this strain.

The selective wavelength becomes shorter as the strain increases, and becomes longer with the decrease in the strain because of the relationship with the refractive index of the wavelength selective element 12.

That is, when the piezoelectric element 15 applies pressure, the selective wavelength on the side of the piezoelectric element 15 shifts to the side of the shorter wavelength compared to the selective wavelength on the side of the absorbing member 16.

Here, the regions selected by the light emitted from the light emitting elements 11a, 11b, 11c, 11d, and 11e (light selective regions) in one base member that forms the wavelength selective element 12 are taken as the regions A, B, C, D, and E.

However, since regions A, B, C, D, and E are regions on which the magnitude of the selective wavelength and strain actually varies gradually and continuously, no physical boundary exists between these regions.

The magnitude of the strain is maximum on the side of the first end face 12c on which the piezoelectric element 15 is installed, and the magnitude of the strain gradually reduces on moving toward the side of the second face 12b on which the absorbing member 16 is installed. Therefore, the magnitude of the strain becomes maximum in the region E closest to the piezoelectric element 15. The magnitude of the strain reduces sequentially in the regions in the order: D, C, B, and A.

Consequently, the selective wavelength of the wavelength selective element 12, that is, the wavelength of light W1 reflected by the wavelength selective element 12 varies corresponding to the regions A, B, C, D, and E.

The selective wavelength becomes shorter as the strain increases and becomes longer as the strain decreases. Therefore, the selective wavelength becomes shortest in the region E closest to the piezoelectric element 15, and the selective wavelength becomes longer sequentially in regions D, C, B and A respectively.

That is, if the wavelengths of light W1 reflected by the regions A, B, C, D, and E of the wavelength selective element 12 are taken as $\lambda 1$, $\lambda 2$, $\lambda 3$, $\lambda 4$ and $\lambda 5$, then $\lambda 1 > \lambda 2 > \lambda 3 > \lambda 4 > \lambda 5$.

In this way, the wavelength of light W1 reflected by the wavelength selective element 12 differs according to the region A, B, C, D, and E. Thus, the reflection of the light is repeated between the light emitting section 11 and the wavelength selective element 12, and after amplification, the wavelength of light W2 emitted from the wavelength selective element also differs according to the region A, B, C, D, and E.

The wavelength of the light W2 emitted from the wavelength selective element 12 is substantially identical to the wavelength of light W1 reflected by the wavelength selective element 12.

Thus, the wavelengths of light W2 emitted from the regions A, B, C, D, and E of the wavelength selective element 12 are $\lambda 1$, $\lambda 2$, $\lambda 3$, $\lambda 4$ and $\lambda 5$ respectively, and also their relationship becomes: $\lambda 1 > \lambda 2 > \lambda 3 > \lambda 4 > \lambda 5$.

Since the wavelengths $\lambda 1$, $\lambda 2$, $\lambda 3$, $\lambda 4$ and $\lambda 5$ vary according to the magnitude of the strain, the values of $\lambda 1$, $\lambda 2$, $\lambda 3$, $\lambda 4$ and $\lambda 5$, and the difference in the magnitude of these values can be adjusted to the desired values by controlling the piezoelectric element 15.

Next, a detailed example of the light source device 10 related to the first embodiment is described here.

First, the light emitting elements 11a, 11b, 11c, 11d, and 11e are semiconductor lasers of red color. Each of the light emitting elements has a peak wavelength of emitted light of 630 nm.

These peak wavelengths need not match exactly within the light emitting elements 11a to the light emitting element 11e. A slight variation is permitted.

Generally, they may differ by a few nm because of manufacturing errors in the light emitting elements.

At this stage, if the piezoelectric element 15 is controlled such that the selective wavelengths $\lambda 1$, $\lambda 2$, $\lambda 3$, $\lambda 4$, and $\lambda 5$ in the regions A, B, C, D, and E of the wavelength selective element 12 become 630 nm, 626 nm, 627 nm, 629 nm, and 628 nm respectively (the difference in the selective wavelength is 4 nm maximum), then the wavelength of light W2 emitted from the regions A, B, C, D, and E of the wavelength selective element 12 also become 630 nm, 626 nm, 627 nm, 629 nm, and 628 nm respectively.

As described above, if the wavelength selective element 12 having a plurality of light selective regions A, B, C, D, and E with different selective wavelengths from each other is provided in one base member in the light source device 10 related to the first embodiment, the wavelengths of light emitted from each of the regions A, B, C, D, and E can be made different from each other.

Accordingly, the band of light emitted from the wavelength selective element 12 expands compared to the case in which the light of the identical wavelength is emitted from all the regions. Therefore, the coherence of the laser light beams decreases.

As the result, the light source device 10 with suppressed speckle noise can be attained.

Since the wavelength selective element 12 is the same size as normally used, the device does not increase in size, and the entire device can be made smaller compared to the conventional structure in which diffusion elements or exciting devices are used to reduce the speckle noise.

The light source device 10 of the invention is small in size, and can reduce the coherence of the laser light beams, and can suppress speckle noise.

In the first embodiment, the peak wavelengths of the light emitting elements 11a, 11b, 11c, 11d, and 11e were used that substantially coincided, but light emitting elements in which the peak wavelengths differ may be actively used.

That is, the light emitting elements 11a, 11b, 11c, 11d, and 11e may be used in which the peak wavelengths sequentially decrease in value, and the piezoelectric element 15 may be controlled such that light of the same length as the peak wavelength of each of the light emitting element 11a to the light emitting element 11e is selected in the regions A, B, C, D, and E.

Also, to facilitate the transmission of strain in the wavelength selective element 12 by the piezoelectric element 15 to the desired state, the shape of the wavelength selective element 12 may be made asymmetrical, that is, the cross section area may be made to reduce from the second end face 12b while moving toward the first end faces 12c.

As a detailed example, the maximum difference in the selective wavelengths in the regions A, B, C, D, and E of the wavelength selective element 12 was made 4 nm, but if this difference is within the maximum range of 10 nm, the chromaticity of light sensed by human beings does not change.

In this way, by suppressing the difference in selective wavelengths in the regions A, B, C, D, and E within the maximum range of 10 nm, for example, by using the light source device 10 in the image display device, an extremely clear image can be displayed.

The piezoelectric element 15 was used as the strain application section, but it is not limited to this element. For example, strain gauge or magnetostrictive element may be used.

Second Embodiment

Next, the second embodiment related to the invention is described hereafter referring to FIG. 2.

In each of the embodiments described hereafter, the same reference numerals are used at locations common to the configuration of the light source device 10 related to the first embodiment mentioned above, and explanations are omitted.

In the light source device 20 related to the second embodiment, a heat emitting element 21 and a heat absorbing element 22 are provided instead of the piezoelectric element 15 and the absorbing member 16 of the first embodiment.

All other points are the same as the first embodiment, including the descriptive examples and examples of modification.

As shown in FIG. 2, the heat emitting element (temperature variation section) 21 is attached in contact with the second end face (end face on the side of region A) 12b perpendicular to the incident face 12a of the wavelength selective element 12 onto which light emitted from the light emitting section 11 is incident.

Also, the heat absorbing element 22 is provided on the first end face (end face on side of the region E) 12c of the wavelength selective element 12.

In this way, the heat emitting element 21 is installed in the second end face 12b of the wavelength selective element 12, and the heat absorbing element 22 is installed in the first end face 12c. Therefore, the wavelength selective element 12 will be heated in a perpendicular direction with respect to the central axis O of the laser light. That is from the side of the heat emitting element 21 toward the side of the heat absorbing element 22.

A temperature gradient will be generated in the wavelength selective element 12 such that the temperature gradually decreases from the heat emitting element 21 toward the heat absorbing element 22.

That is, in the second embodiment, the temperature of the wavelength selective element 12 gradually decreases from the region A toward the region E.

The wavelength selective element 12 thermally expands due to heat and its refractive index changes.

The selective wavelength of the wavelength selective element 12, that is, the wavelength of light W1 reflected by the wavelength selective element 12 varies corresponding to this thermal expansion.

The selective wavelength becomes shorter as the strain increases, and becomes longer with the decrease in the strain, as described in the first embodiment.

The thermal expansion is also considered to be a kind of strain, therefore, selective wavelength on the side of heat emitting element 21 with large thermal expansion due to high temperature shifts toward the long wavelength side compared to the selective wavelength on the side of the absorbing member 16.

That is, if the wavelengths in the regions A, B, C, D, and E of the wavelength selective element 12 are taken as $\lambda 1, \lambda 2, \lambda 3, \lambda 4$, and $\lambda 5$, then $\lambda 1 > \lambda 2 > \lambda 3 > \lambda 4 > \lambda 5$.

Thus, the wavelengths of light W2 emitted from the regions A, B, C, D, and E of the wavelength selective element 12 become $\lambda 1, \lambda 2, \lambda 3, \lambda 4$ and $\lambda 5$ respectively, and also their relationship becomes: $\lambda 1 > \lambda 2 > \lambda 3 > \lambda 4 > \lambda 5$.

In the light source device 20 related to the second embodiment also, effects similar to the light source device of the first embodiment can be obtained.

Temperature can be monitored easily compared to pressure, and control is also easy, therefore, effects similar to the light source device of the first embodiment can be more easily obtained.

Furthermore, in the second embodiment, if optical element such as a hologram having periodic lattice is used as the wavelength selective element 12, then the internal periodic lattice spacing can be varied easily by applying heat to the wavelength selective element 12.

As a result, the coherence of the amplified light beams emitted from region A, B, C, D, and E of the wavelength selective element 12 reduces with a simpler configuration, and thus the speckle noise can be suppressed.

In the second embodiment, heat emitting element was used as the temperature variation section, and the wavelength selective element 12 was heated, but a Peltier element may be used instead of the heat emitting element.

Since heating and cooling are possible when a Peltier element is used, this is especially beneficial when controlling the selective wavelengths $\lambda 1, \lambda 2, \lambda 3, \lambda 4$ and $\lambda 5$ in the regions A, B, C, D, and E of the wavelength selective element 12 to the desired values.

Moreover, heat may be released by methods such as cooling in air without using the heat absorbing element 22.

Also, to control the selective wavelengths $\lambda 1, \lambda 2, \lambda 3, \lambda 4$ and $\lambda 5$, temperature sensors such as thermistors may be installed in the regions A, B, C, D, and E of the wavelength selective element 12 and the temperature may be measured. Depending on the measured temperature, the heating temperature due to the heat emitting element 21 and the heating time may be controlled, and the current flowing through the Peltier element may also be controlled.

Third Embodiment

Next, the third embodiment related to the invention is described hereafter referring to FIG. 3.

The wavelength selective element in the light source device 30 related to the third embodiment differs from the first embodiment in that a wavelength selective element 33 is made of a wavelength selective film formed on the substrate 32.

All other points are the same as the first embodiment, including the descriptive examples.

As shown in FIG. 3, the wavelength selective element 33 is formed on a substrate 32 having optical transparency and the first film 31a, the second film 31b and the third film 31c are stacked sequentially from the side of substrate 32.

Glass, for example, may be used as the substrate 32.

As the material of the second film 31b, for example, $TiO_2$ may be used.

As the material of the first film 31a and the third film 31c, for example, $SiO_2$ may be used.

The type and quantity of films that form the wavelength selective element 33 may be appropriately selected according to the desired characteristics.

Since this point is well-known, details are omitted here.

The wavelength selective element 33 is formed so that its overall thickness becomes smaller by reducing the thickness of the films 31a, 31b, and 31c, respectively as moving from a first end 33b toward a second end 33c.

This kind of wavelength selective element 33 may be formed by oblique deposition.

The selective wavelength of the wavelength selective element 33, that is, the wavelength of light W1 reflected by the wavelength selective element 33 varies corresponding to change in thickness of this film.

The selective wavelength becomes longer as the thickness of the film increases. The selective wavelength becomes shorter as the thickness of the film decreases.

The thickness of film of the portion through which the laser light passes, namely J, K, L, M, and N in the regions A, B, C, D, and E becomes smaller sequentially moving from region A, B, C, D, and E. Thus, the selective wavelengths λ1, λ2, λ3, λ4, and λ5 in each region satisfies the condition: λ1>λ2>λ3>λ4>λ5.

Since the wavelengths λ1, λ2, λ3, λ4, and λ5 vary according to the material, number of layers, thickness, and so on of the film, the values of λ1, λ2, λ3, λ4, and λ5, and the difference in the magnitude of these values can be adjusted to the desired values by controlling these elements.

In the light source device 30 related to the third embodiment also, effects similar to the light source device of the first embodiment can be obtained.

Moreover, in the light source device 30 related to the third embodiment, the selective wavelength can be properly controlled by adjusting the film thickness, and there is no need for mechanical controls.

Consequently, by using a simpler configuration compared to the first and the second embodiments, the coherence of the light beams emitted from each region of the wavelength selective element 33 correctly reduces, and the speckle noise can be suppressed.

In the third embodiment, the peak wavelengths of the light emitting elements 11a, 11b, 11c, 11d, and 11e that substantially coincided were used, as described in the first embodiment, but light emitting elements in which the peak wavelengths differ may be actively used.

Also, in the third embodiment, the thickness of the film was made to gradually reduce from the first end 33b toward the second end 33c, but the thickness may be changed according to each region of the wavelength selective element 33.

Fourth Embodiment

Figure 4:
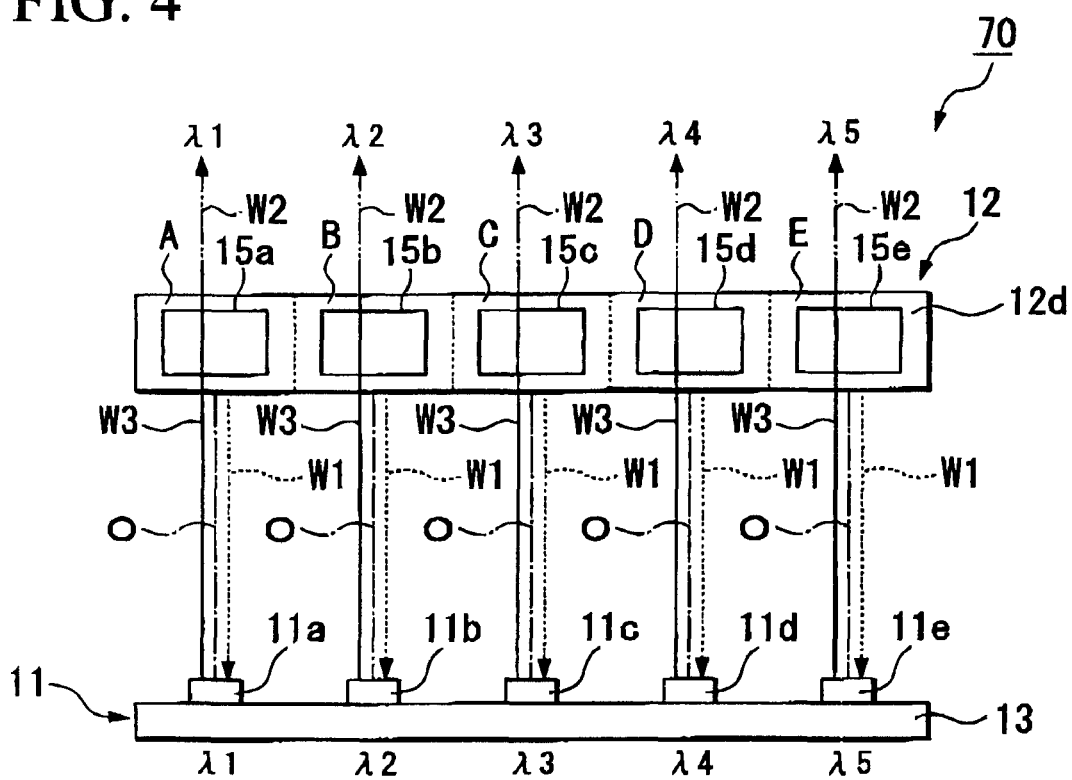
FIG. 4 is a plan view of the light source device related to a fourth embodiment of the invention.

Next, the fourth embodiment related to the invention is described hereafter referring to FIG. 4.

The light source device 70 related to the fourth embodiment differs from the first embodiment in that piezoelectric elements 15a, 15b, 15c, 15d, and 15e are provided for each region A, B, C, D, and E of the wavelength selective element 12 instead of the piezoelectric element 15 and the absorbing member 16 provided in the wavelength selective element 12.

All other points are the same as the first embodiment, including the descriptive examples.

As shown in FIG. 4, the piezoelectric elements (strain application sections) 15a, 15b, 15c, 15d, and 15e are installed at a predetermined spacing in each of the regions A, B, C, D, and E on the surface 12d of the wavelength selective element 12 of the fourth embodiment.

Also, damping member may be provided between the adjacent piezoelectric elements 15a, 15b, 15c, 15d, and 15e so that strain is not transmitted between the adjacent regions.

These piezoelectric elements 15a, 15b, 15c, 15d, and 15e may apply strain to the regions A, B, C, D, and E so as to vary the magnitude of the strain on the regions A, B, C, D, and E.

The piezoelectric elements 15a, 15b, 15c, 15d, and 15e are made similar to the piezoelectric element 15 of the first embodiment. Therefore, piezoelectric elements are displaced when voltage is applied, and strain is generated in the wavelength selective element 12 because of this displacement.

Figure 5A:
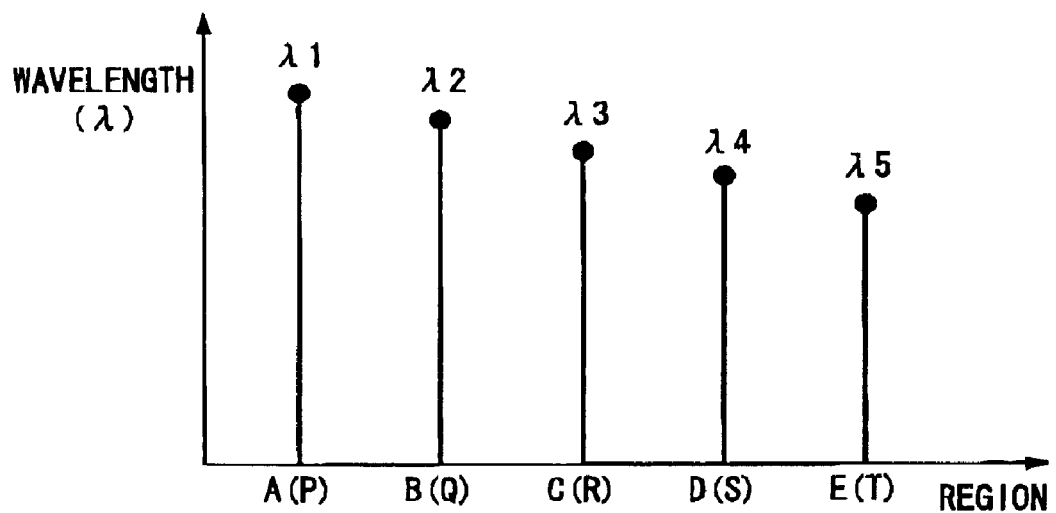
FIGS. 5A and 5B are an output wavelength of a light emitting element of the light source device of FIG. 4.

As shown in FIG. 5A, the wavelength selective element 12 was controlled in the first embodiment such that the selective wavelengths λ1, λ2, λ3, λ4, and λ5 in the wavelength selective element 12 became successively smaller when proceeding from region A toward region E.

Figure 5B:
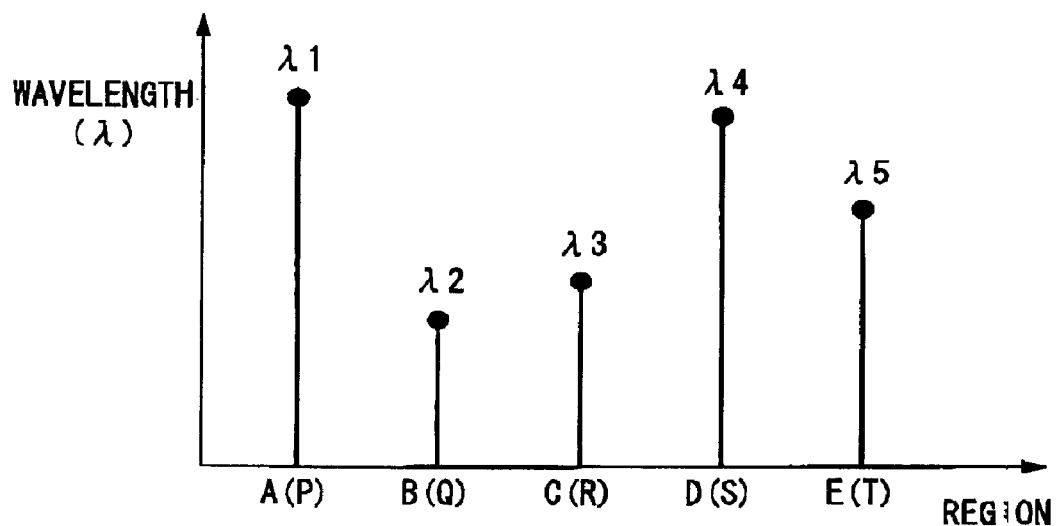

As shown in FIG. 5B, the wavelength selective element 12 can be controlled in the fourth embodiment such that the selective wavelengths λ1, λ2, λ3, λ4, and λ5 become an intermittent wavelength distribution (random wavelength distribution).

The distribution shown in FIG. 5B is merely an example.

Thus, in the fourth embodiment, for example, elements in which peak wavelengths λ1, λ2, λ3, λ4, and λ5 of light emitted from the light emitting elements 11a, 11b, 11c, 11d, and 11e are 630 nm, 626 nm, 627 nm, 629 nm, and 628 nm respectively, are used because of manufacturing errors.

At this stage, the refractive index of each region from A, B, C, D, and E is changed by controlling the strain in the regions A, B, C, D, and E of the wavelength selective element 12 by the piezoelectric elements 15a, 15b, 15c, 15d, and 15e.

The strain in each region A, B, C, D, and E is controlled such that the selective wavelengths λ1, λ2, λ3, λ4, and λ5 in each of the regions A, B, C, D, and E become 630 nm, 626 nm, 627 nm, 629 nm, and 628 nm respectively.

In the light source device 70 related to the fourth embodiment also, the speckle noise can be reduced similar to the light source device of the first embodiment.

Moreover, in the fourth embodiment, the degree of freedom of the output wavelength distribution emitted from the wavelength selective element 12 can be enhanced because piezoelectric elements 15a, 15b, 15c, 15d, and 15e have been installed to the regions A, B, C, D, and E, respectively.

Accordingly, the wavelength of light emitted from light emitting elements 11a, 11b, 11c, 11d, and 11e and the corresponding wavelength of light selected for each of the regions A, B, C, D, and E of the wavelength selective element 12 can be aligned.

As a result, even if variation exists in the output wavelength due to manufacturing errors in the light emitting elements 11a, 11b, 11c, 11d, and 11e, the light utilization efficiency of light emitted from the wavelength selective element 12 can be enhanced.

Furthermore, since piezoelectric elements 15a, 15b, 15c, 15d, and 15e have been provided for each of the regions A, B, C, D, and E, the difference in the selective wavelengths for the regions A, B, C, D, and E can be increased or decreased regardless of the figure of 1 nm. Thus, the speckle noise can be reduced more efficiently.

Light emitting elements 11a, 11b, 11c, 11d, and 11e that intentionally emit light of differing wavelengths may also be used.

Also, all equal peak wavelengths of light emitted from the light emitting elements 11a, 11b, 11c, 11d, and 11e may be used similar to the first embodiment.

In such a configuration, the speckle noise can be reduced by controlling the strain in each of the regions A, B, C, D, and E such that the selective wavelengths of each of the regions A, B, C, D, and E differ.

Furthermore, the strain may be controlled using a piezoelectric element for the light selective regions A, B, C, D, and E, that is, by taking, for example, two regions together.

In this configuration also, strain may be applied such that the wavelengths of light selected by the light selective regions are different from each other.

Moreover, Peltier elements (temperature variation sections) may be provided in each of the regions A, B, C, D, and E instead of the piezoelectric elements 15a, 15b, 15c, 15d, and 15e.

Even when Peltier element is used, thermal expansion occurs by controlling the temperature in the regions A, B, C, D, and E of the wavelength selective element 12, and the refractive index of each of the regions A, B, C, D, and E changes, similar to the case when piezoelectric element is used.

The temperature in each of the regions A, B, C, D, and E is controlled such that the selective wavelengths λ1, λ2, λ3, λ4, and λ5 in each of the regions A, B, C, D, and E become 630 nm, 626 nm, 627 nm, 629 nm, and 628 nm respectively.

Even with this configuration, the speckle noise can be suppressed, and the light utilization efficiency can be enhanced.

Since the temperature in each of the regions A, B, C, D, and E of the wavelength selective element 12 can be increased and decreased by using Peltier element as the temperature variation section, the selective wavelengths of the wavelength selective element can be matched more accurately with the wavelengths of light emitted from the light emitting elements 11a, 11b, 11c, 11d, and 11e.

The temperature of each of the regions A, B, C, D, and E of the wavelength selective element 12 may be changed using electrically heated wire and so on, as the heat emitting element (temperature variation section) instead of the Peltier element.

Fifth Embodiment

Figure 6:
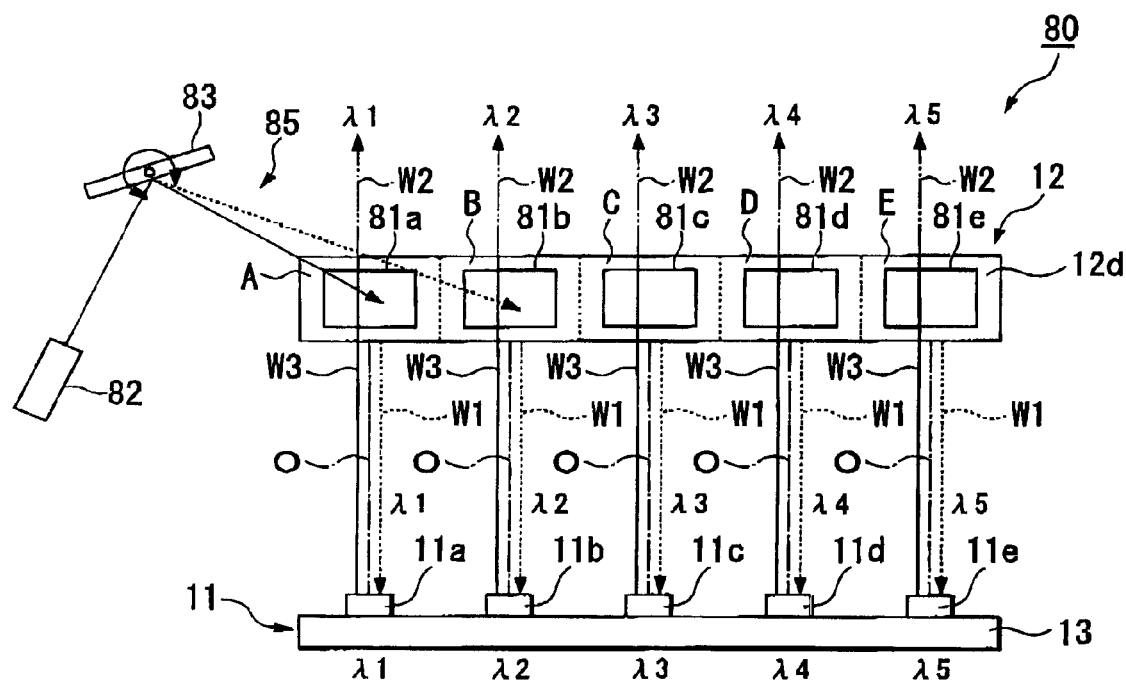
FIG. 6 is a plan view of the light source device related to a fifth embodiment of the invention.

Next, the fifth embodiment related to the invention is described hereafter referring to FIG. 6.

The light source device 80 related to the fifth embodiment differs from the fourth embodiment in that heat absorbing films 81a, 81b, 81c, 81d, and 81e are provided instead of the piezoelectric elements 15a, 15b, 15c, 15d, and 15e of the fourth embodiment.

All other points are the same as the fifth embodiment, including the descriptive examples.

The temperature variation section 85 used in the light source device 80 includes a laser light source 82 for generating heat, a mirror 83, and heat absorbing films 81a, 81b, 81c, 81d, and 81e.

As shown in FIG. 6, the heat absorbing films 81a, 81b, 81c, 81d, and 81e are provided in each of the regions A, B, C, D, and E on the surface 12d at a predetermined spacing.

The film thickness of each of the heat absorbing films 81a, 81b, 81c, 81d, and 81e is the same.

Insulating member may be provided between the adjacent heat absorbing films 81a, 81b, 81c, 81d, and 81e so that heat is not transmitted between the adjacent regions A, B, C, D, and E.

The mirror 83 is used for scanning the laser light emitted by the laser light source for generating heat toward the heat absorbing films 81a, 81b, 81c, 81d, and 81e.

The length of time for which the laser light emitting onto the heat absorbing films 81a, 81b, 81c, 81d, and 81e is adjusted by controlling the inclination of the mirror 83.

As a result, the longer the time for which the laser light emits, the higher is the temperature of the heat absorbing films 81a, 81b, 81c, 81d, and 81e. Thus, the temperature of the regions A, B, C, D, and E increases.

In the fifth embodiment also, the temperature in each of the regions A, B, C, D, and E of the wavelength selective element 12 is controlled such that the peak wavelengths of the light emitting elements 11a, 11b, 11c, 11d, and 11e coincide, similar to the above described embodiment.

In the light source device 80 related to the fifth embodiment also, the speckle noise can be reduced similar to the light source device of the first embodiment.

Furthermore, according to the fifth embodiment, the light utilization efficiency of light emitted from the wavelength selective element 12 can be enhanced similar to the fifth embodiment.

The film thicknesses of the heat absorbing films 81a, 81b, 81c, 81d, and 81e were made the same in the fifth embodiment, but the film thickness of the heat absorbing films 81a, 81b, 81c, 81d, and 81e may be made unequal.

This configuration enables temperature distribution to be provided in each of the regions A, B, C, D, and E of the wavelength selective element 12 without varying the scan rate of the mirror 83.

That is, since the scan rate per scan of the mirror 83 in the regions A, B, C, D, and E is fixed, mirror 83 can be easily controlled.

The heat absorbing films 81a, 81b, 81c, 81d, and 81e were provided for each of the regions A, B, C, D, and E, but they may be provided all over the surface 12d of the wavelength selective element 12.

Moreover, MEMS mirror may be used as the mirror 83.

Sixth Embodiment

Figure 7:
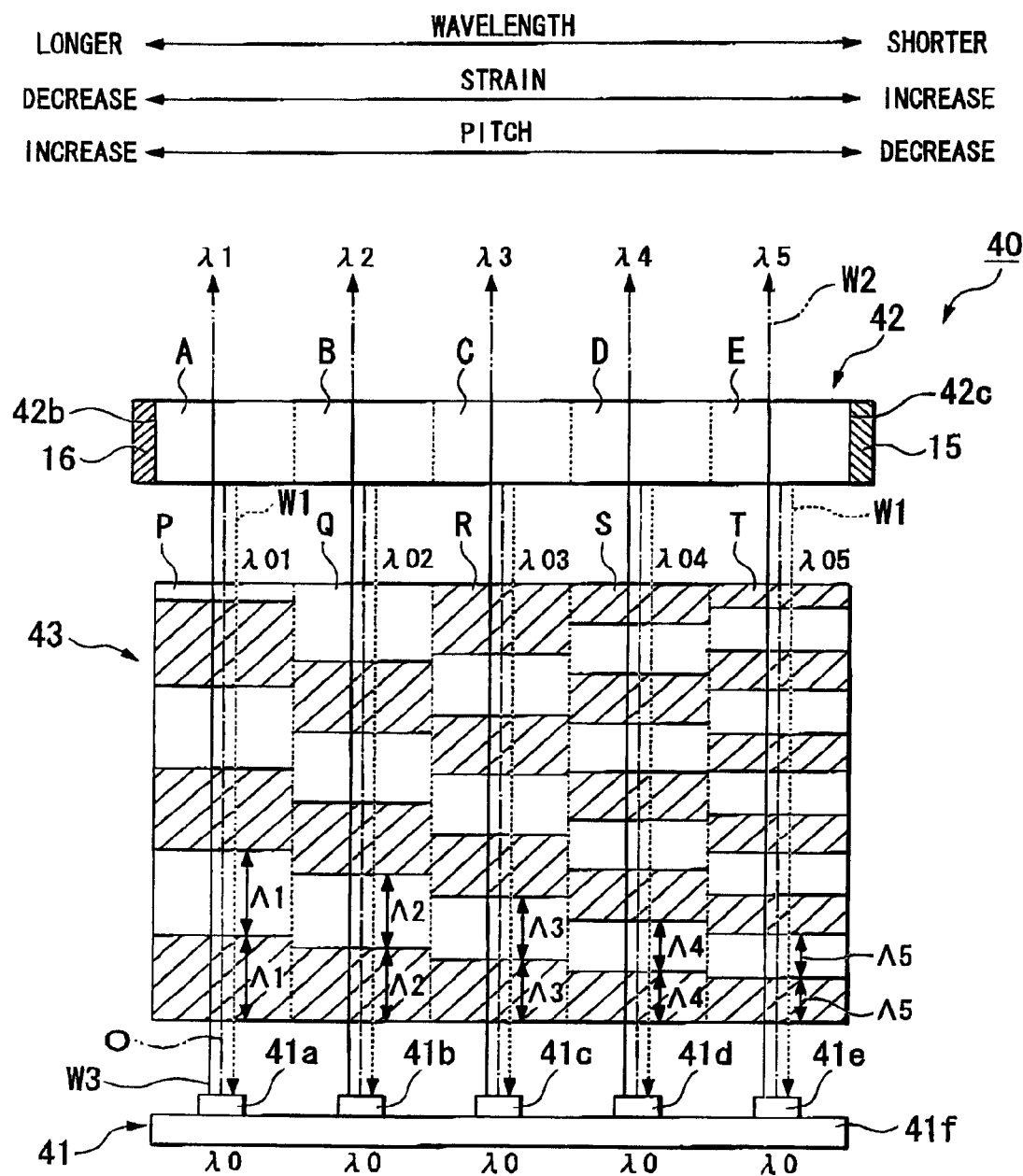
FIG. 7 is a plan view of the light source device related to a sixth embodiment of the invention.

Next, the sixth embodiment related to the invention is described hereafter referring to FIG. 7.

As shown in FIG. 7, the light source device 40 related to the sixth embodiment, includes a light emitting section 41, a wavelength conversion element 43, and a wavelength selective element 42.

The wavelength conversion element 43 converts the wavelength of light emitted from the light emitting section 41.

The wavelength selective element 42 selects and reflects the wavelength converted by the wavelength conversion element 43.

The light emitting section 41 includes five light emitting elements 41a, 41b, 41c, 41d, and 41e that are supported in a linear shape in the support member 41f.

The peak wavelengths of light λ0 emitted from the light emitting element 41a, 41b, 41c, 41d, and 41e substantially coincide.

However, the wavelengths may vary slightly, they need not necessarily coincide perfectly.

Generally, they may differ by a few nm because of manufacturing errors in the light emitting elements.

For example, in the case of a blue laser light source device that emits blue laser light, the peak wavelength λ0 is 920 nm, in case of a green laser light source device that emits green laser light, the peak wavelength λ0 is 1060 nm, and in case of a red laser light source device that emits red laser light, the peak wavelength λ0 is 1240 nm.

However, the wavelength mentioned above is merely an example.

The wavelength conversion element (second high harmonic generating element; SHG Second Harmonic Generation) 43 is a non-linear optical element that converts the incident light into substantially half the wavelength.

The light W3 emitted from the light emitting section 41 and heading toward the wavelength selective element 42 is converted into light of substantially half the wavelength when the light W3 passes through the wavelength conversion element.

The wavelength conversion efficiency by the wavelength conversion element 43 has non-linear characteristics. For example, the stronger the intensity of laser light incident on the wavelength conversion element 43, the higher is the conversion efficiency.

The conversion efficiency of the wavelength conversion element 43 is approximately 40% to 50%.

That is, not all the laser light emitted from the light emitting section 41 is converted into laser light of the predetermined wavelength.

The wavelength conversion element 43 is a sheet in shape.

The wavelength conversion element 43 is divided into five regions P, Q, R, S, and T corresponding to the light emitting elements 41a, 41b, 41c, 41d, and 41e.

That is, the regions through which the light emitted from the light emitting elements 41a, 41b, 41c, 41d, and 41e passes are taken as P, Q, R, S, and T (light pass-through regions).

The wavelength conversion element 43 has a polarization periodic structure corresponding to each of the regions P, Q, R, S, and T, that is, the polarization has a reversed domain-repetitive structure with respect to each other.

When the light in the polarization periodic structure passes through, the wavelength of the incident light will be converted.

The width in the direction of the central axis of the laser light (hereafter referred to as "pitch") of each domain of the regions P, Q, R, S, and T of the wavelength conversion element 43 is $\Lambda 1$, $\Lambda 2$, $\Lambda 3$, $\Lambda 4$, and $\Lambda 5$.

Pitch $\Lambda 1$, $\Lambda 2$, $\Lambda 3$, $\Lambda 4$, and $\Lambda 5$ are mutually different, and $\Lambda 1 > \Lambda 2 > \Lambda 3 > \Lambda 4 > \Lambda 5$.

This kind of polarization periodic structure can be produced, for example, by applying the manufacturing method disclosed in the Japanese Unexamined Patent Application, First Publication No. H04-19719.

That is, first a striped-shape electrode patterns with regions having electrodes and regions having no electrodes alternately disposed along the direction of the central axis O of the laser light are formed on the substrate made of a non-linear ferrodielectric material (such as $LiTaO_3$).

At this stage, the width of each electrode pattern and the spacing of electrode patterns are optimized such that the pitch of each domain in the regions P, Q, R, S, and T become $\Lambda 1$, $\Lambda 2$, $\Lambda 3$, $\Lambda 4$, and $\Lambda 5$.

That is, the width and spacing of the electrode patterns differ in each of the regions P, Q, R, S, and T.

Next, a polarization periodic structure as shown in FIG. 7 can be obtained by applying voltage in pulse form on these electrode patterns.

After forming the polarization periodic structure in this way, commonly, the electrode patterns are removed, but they may also be retained as they are.

In this way, the wavelength conversion element 43 has a polarization reversed structure with differing period (pitch) in each of the regions P, Q, R, S, and T.

Accordingly, among the various wavelength components included in light of peak wavelength $\lambda 0$, the components of wavelength $\lambda 01$, $\lambda 02$, $\lambda 03$, $\lambda 04$, and $\lambda 05$ that differ slightly from each other in the light passing through the regions P, Q, R, S, and T are subjected to conversion action, and are converted into wavelengths $\lambda 1$, $\lambda 2$, $\lambda 3$, $\lambda 4$, and $\lambda 5$ respectively that differ slightly from each other.

If the example of wavelength of blue laser light source device is taken, then light near the wavelength of $\lambda 01=920$ nm, $\lambda 02=918$ nm, $\lambda 03=916$ nm, $\lambda 04=914$ nm, $\lambda 05=912$ nm from light of peak wavelength $\lambda 0=920$ nm emitted from the light emitting elements 41a, 41b, 41c, 41d, and 41e respectively is converted into light of wavelength $\lambda 1=460$ nm, $\lambda 2=459$ nm, $\lambda 3=458$ nm, $\lambda 4=457$ nm, and $\lambda 5=456$ nm.

Similarly, if the example of wavelength of green laser light source device is taken, then light near the wavelength of $\lambda 01=1060$ nm, $\lambda 02=1058$ nm, $\lambda 03=1056$ nm, $\lambda 04=1054$ nm, $\lambda 05=1052$ nm from light of peak wavelength $\lambda 0=1060$ nm emitted from the light emitting elements 41a, 41b, 41c, 41d, and 41e respectively is converted into light of wavelength $\lambda 1=530$ nm, $\lambda 2=529$ nm, $\lambda 3=528$ nm, $\lambda 4=527$ nm, and $\lambda 5=526$ nm.

Also similarly, if the example of wavelength of red laser light source device is taken, then light near the wavelength of $\lambda 01=1240$ nm, $\lambda 2=1238$ nm, $\lambda 3=1236$ nm, $\lambda 04=1234$ nm, $\lambda 5=1232$ nm from light of peak wavelength of 1240 nm emitted from the light emitting elements 41a, 41b, 41c, 41d, and 41e respectively is converted into light of wavelength $\lambda 1=620$ nm, $\lambda 2=619$ nm, $\lambda 3=618$ nm, $\lambda 4=617$ nm, and $\lambda 5=616$ nm.

However, the wavelength mentioned above is merely an example.

The wavelength selective element 42 selects only the laser light W1 (that is, light of wavelength $\lambda 01$, $\lambda 2$, $\lambda 3$, $\lambda 04$, and $\lambda 05$) that has not been converted into the predetermined wavelengths $\lambda 1$, $\lambda 2$, $\lambda 3$, $\lambda 4$, and $\lambda 5$ by the wavelength conversion element 43, reflects the selected laser light toward the light emitting section 41, and passes through the remaining laser light.

The structure of the wavelength selective element 42 is similar to that in the first embodiment. The piezoelectric element 15 is provided on the first end face (end face on the side of the region E) 42c and an absorbing member 16 is provided on the second end face (end face on the side of region A) 42b.

The piezoelectric element 15 is controlled such that the wavelengths $\lambda 01$, $\lambda 02$, $\lambda 03$, $\lambda 04$, and $\lambda 05$ of laser light that have not been converted in the regions P, Q, R, S, and T, and the wavelengths of light selected in the regions A, B, C, D, and E of the wavelength selective element have the same values.

That is, in case of a blue laser light source device, for example, the piezoelectric element 15 is controlled such that the wavelengths of light reflected in the regions A, B, C, D, and E become 920 nm, 918 nm, 916 nm, 914 nm, and 912 nm, respectively.

In case of green laser light source device, for example, the piezoelectric element 15 is controlled such that the wavelengths of light reflected in the regions A, B, C, D, and E become 1060 nm, 1058 nm, 1056 nm, 1054 nm, and 1052 nm, respectively.

In case of red laser light source device, for example, the piezoelectric element 15 is controlled such that the wavelengths of light reflected in the regions A, B, C, D, and E become 1240 nm, 1238 nm, 1236 nm, 1234 nm, and 1232 nm, respectively.

However, the wavelength mentioned above is merely an example.

The light W1 (dotted line shown in FIG. 7) reflected by the wavelength selective element 42 passes through the wavelength conversion element 43 again, and returns to the light emitting elements 41a, 41b, 41c, 41d, and 41e.

A part of the light returned to the light emitting elements 41a, 41b, 41c, 41d, and 41e is absorbed and becomes heat, but most of the light is used as energy for emission, and is reflected within the light emitting elements 41a, 41b, 41c, 41d, and 41e, and again emitted from the light emitting elements 41a, 41b, 41c, 41d, and 41e and so on, and is thus effectively used.

On the other hand, the light W2 (dashed and two-dotted line in FIG. 7) converted into wavelengths $\lambda 1$, $\lambda 2$, $\lambda 3$, $\lambda 4$ and $\lambda 5$ passing through the wavelength selective element 42 by the wavelength conversion element 43 passes through the wavelength selective element 42.

As described above, the light W3 emitted from the light emitting section 41 is repeatedly reflected between the light emitting section 41 and the wavelength selective element 42, while the converted light W2 (dashed and two-dotted line in FIG. 7) converted into the predetermined wavelength is emitted from the wavelength selective element 42.

That is, although the operation of the wavelength selective element 42 differs slightly compared to the wavelength selective elements 12 and 33 of the first to the third embodiments, the wavelength selective element 42 has the function of operation as a resonator mirror of the light emitting elements 41a, 41b, 41c, 41d, and 41e.

By varying the pitch of the domain in the regions P, Q, R, S, and T in the light source device 40 related to the sixth embodiment, and by combining the wavelength conversion element 43 that enables conversion of differing wavelengths λ1, λ2, λ3, λ4 and λ5, and the piezoelectric element 15 including the light selective regions A, B, C, D, and E of differing selective wavelengths, the wavelength of light emitted from the wavelength selective element 42 can be made to differ from each other.

Accordingly, the band of light emitted from the wavelength selective element 12 expands compared to the case in which the light of the same wavelength is emitted from all the regions. Therefore, the coherence of the laser light beams decreases.

The result is that light source device 40 with suppressed speckle noise can be attained.

Since the wavelength conversion element 43 and the wavelength selective element 42 are the same size as normally used, the device does not increase in size, and the entire device can be made smaller compared to the conventional device in which diffusion elements or exciting devices were used to reduce the speckle noise.

The light source device 40 of the invention is small in size, and can reduce the coherence of the laser light beams, and can suppresses speckle noise.

In the sixth embodiment, the peak wavelengths of a plurality of light emitting elements 41a, 41b, 41c, 41d, and 41e that substantially coincided were used, but light emitting elements in which the peak wavelengths differ may be actively used.

That is, the piezoelectric element 15 may be controlled such that the light emitting elements 41a, 41b, 41c, 41d, and 41e is used so that each of the peak wavelengths becomes λ01, λ02, λ03, λ04, and λ05, and such that light of wavelength same as the peak wavelength of the light emitting elements 41a, 41b, 41c, 41d, and 41e are selected in the regions A, B, C, D, and E.

In this way, by coinciding the peak wavelengths of the light emitting elements 11a, 11b, 11c, 11d, and 11e, and the selective wavelengths in the regions A, B, C, D, and E of the wavelength selective element 42, the light utilization efficiency can be enhanced.

By providing the piezoelectric element 15 only on the first end face 12c of the wavelength selective element 42 in the sixth embodiment, the selective wavelength gradually increases in length on proceeding from the side of the piezoelectric element 15 toward the side of the absorbing member 16. However, as shown in the fourth embodiment, individual piezoelectric elements can be provided in each region of the wavelength selective element, and the strain in each of these regions may be controlled.

Moreover, as shown in the fifth embodiment, the temperature of each region may also be controlled by heat absorbing film.

Also, to facilitate the transmission of strain in the wavelength selective element 42 by the piezoelectric element 15 to the desired state, the shape of the wavelength selective element 42 may be made asymmetrical, that is, the cross section area may be made to reduce from the second end face 42b while moving toward the first end face 42c.

As a detailed example, the maximum difference in the wavelengths of light W2 emitted from the regions A, B, C, D, and E was made 4 nm, but if this difference is within the maximum range of 10 nm, the chromaticity of light sensed by human beings does not change.

In this way, by suppressing the difference in wavelengths of light emitted from the regions A, B, C, D, and E within the maximum range of 10 nm, for example, by using the light source device 40 in the image display device, an extremely clear image can be displayed.

The piezoelectric element 15 was used as the strain application section, but it is not limited to this element; for example, a strain gauge or magnetostrictive element may be used.

Seventh Embodiment

Figure 8:
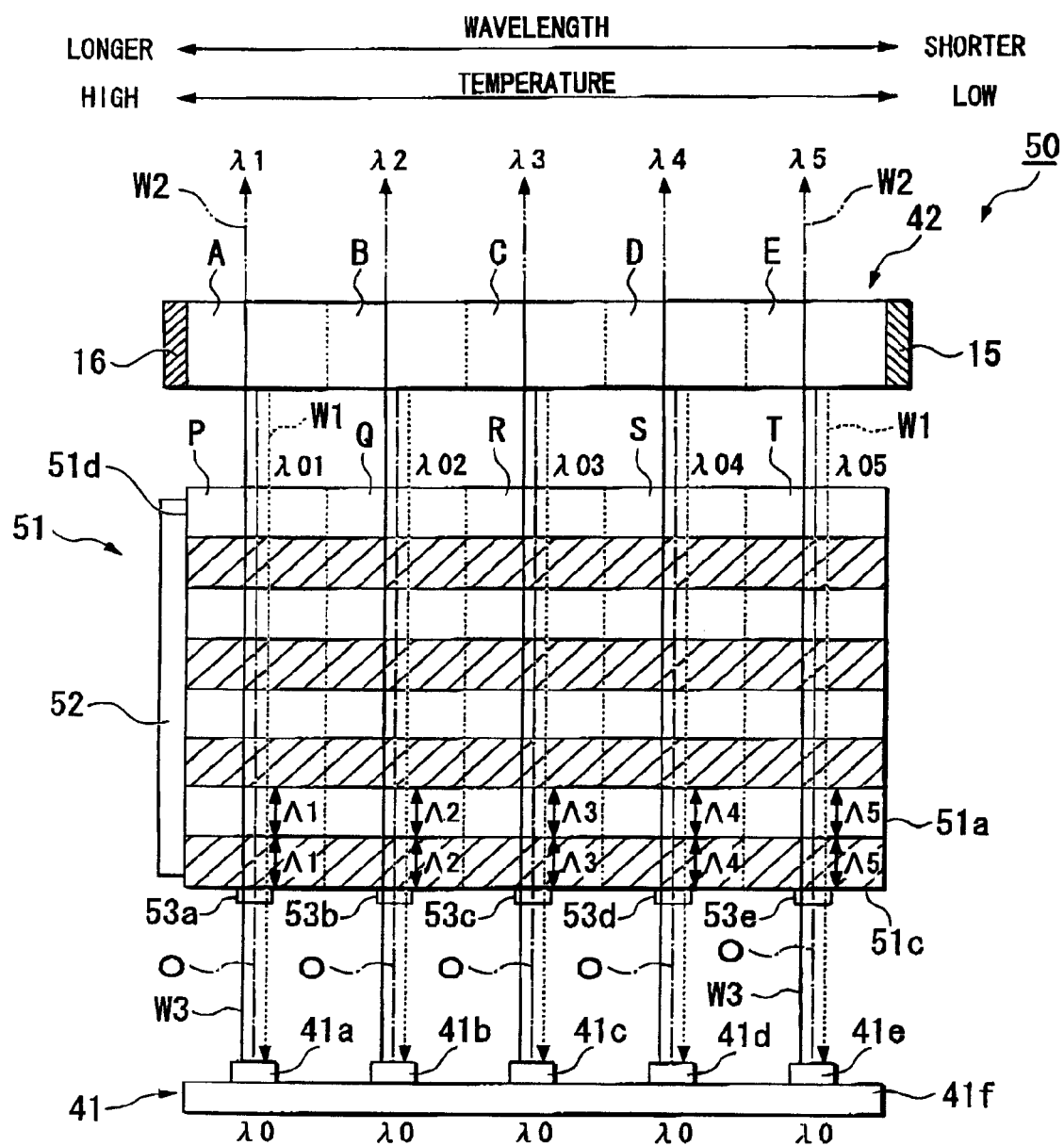
FIG. 8 is a plan view of the light source device related to a seventh embodiment of the invention.

Next, the seventh embodiment related to the invention is described hereafter referring to FIG. 8.

The light source device 50 related to the seventh embodiment differs from the sixth embodiment in that the pitch of the domain of the wavelength conversion element 51 is different and a Peltier element 52 is provided.

All other points are the same as the sixth embodiment, including the descriptive examples and examples of modification.

In the description of the seventh embodiment, the same reference numerals are used at locations common to the configuration of the light source device 40 related to the sixth embodiment mentioned above, and explanations are omitted.

The pitches Λ1, Λ2, Λ3, Λ4, and Λ5 of the domain of polarization periodic structure in the wavelength conversion element 43 of the sixth embodiment differ from each other, and their values reduce sequentially and gradually, but in the wavelength conversion element 51 of the seventh embodiment, the pitches Λ1, Λ2, Λ3, Λ4, and Λ5 remain substantially the same when the operation due to the Peltier element 52 described later, is not received.

In this way, even wavelength conversion element 51 with equal pitches Λ1, Λ2, Λ3, Λ4, and Λ5 of the domain can be produced according to the method described in the sixth embodiment.

All the widths and the spacings of the electrode patterns used for applying voltage in pulse form in the regions P, Q, R, S, and T, may be made the same during the manufacturing process described in the sixth embodiment.

The Peltier element (temperature variation section) 52 is attached in contact with a first end face (end face on the side of region P) 51d perpendicular to the incident face 51c onto which the light emitted from the light emitting section 41 of the wavelength conversion element 51 is incident.

The Peltier element 52 is used to apply an appropriate temperature gradient to the wavelength conversion element 51.

The temperature gradient should be controlled such that light W3 emitted from the light emitting elements 41a, 41b, 41c, 41d, and 41e in each of the regions P, Q, R, S, and T of the wavelength conversion element is converted into the desired wavelengths λ1, λ2, λ3, λ4 and λ5.

The Peltier element 52 is controlled so as to obtain the appropriate temperature gradient, and the Peltier element 52 heats/cools the wavelength conversion element 51.

The Peltier element 52 is controlled using the temperature sensors 53a, 53b, 53c, 53d, and 53e installed for each of the regions P, Q, R, S, and T of the incident face 51c of the wavelength conversion element 51.

That is, the current flowing in the Peltier element 52 is controlled according to the temperature measured by the temperature sensors 53a, 53b, 53c, 53d, and 53e.

These temperature sensors 53a, 53b, 53c, 53d, and 53e are installed at positions avoiding the light W3 incident on the wavelength conversion element 51 and the path of the light W1 that returns from the wavelength conversion element 51, and are configured such that no effect is caused on these light beams.

Here, the temperature gradient applied by the Peltier element 52 is controlled such that its temperature reduces gradually from the side of the first end face 51d (side of region P) on which the Peltier element 52 of the wavelength conversion element 51 is installed toward a second end face 51a on the opposite side of the first end face 51d (side of region T).

That is, temperature gradient that varies gradually from high temperature to low temperature is applied in a direction perpendicular to the central axis O of the incident laser light in the wavelength conversion element 51.

The refractive index of the wavelength conversion element 51 changes according to this temperature gradient, and the domain pitch changes due to the thermal expansion.

The light that has passed through the regions P, Q, R, S, and T receives the effect of the domain pitch change and the change in the refractive index. Among the various wavelength components included in the light of peak wavelength λ0, the components of wavelength λ01, λ02, λ03, λ04, and λ05 that differ slightly from each other are affected by the conversion action, and these components are converted into wavelength λ1, λ2, λ3, λ4 and λ5, which differ slightly from each other.

In the light source device 50 related to the seventh embodiment also, effects similar to the light source device of the sixth embodiment can be obtained.

In the light source device 50 related to the seventh embodiment, the internal structure of the wavelength conversion element 51 is changed by applying temperature gradient with the Peltier element 52 by using wavelength conversion element 51 in which the domain pitch Λ1, Λ2, Λ3, Λ4, and Λ5 are equal to each other.

Accordingly, the pitch Λ1, Λ2, Λ3, Λ4, and Λ5 need not be controlled strictly. Thus, the manufacturing cost of the wavelength conversion element 51 can be reduced, and as a consequence, the manufacturing cost of the light source device 50 can be reduced.

Eighth Embodiment

Figure 9:
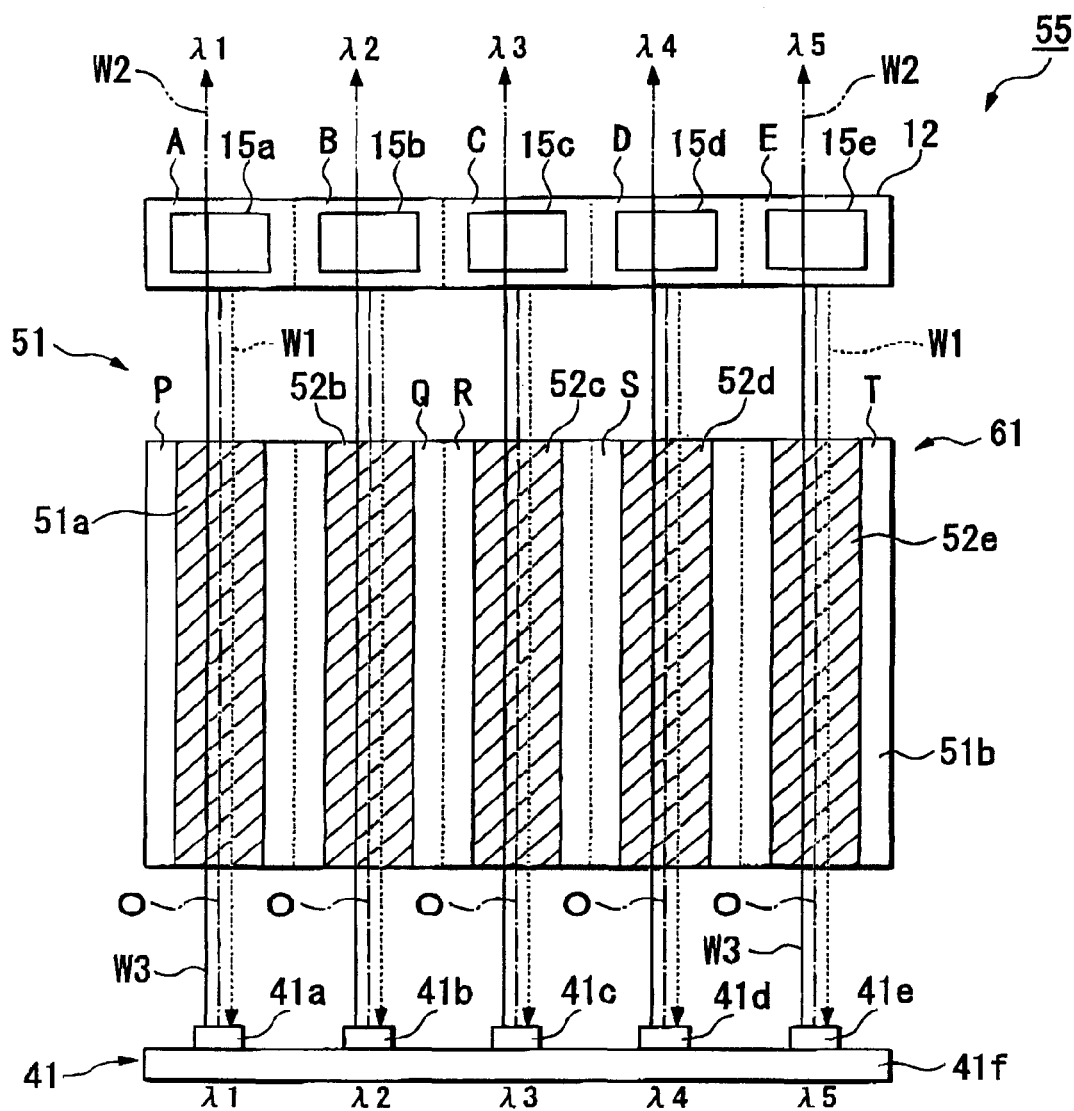
FIG. 9 is a plan view of the light source device related to an eighth embodiment of the invention.

Next, the eighth embodiment related to the invention is described hereafter referring to FIG. 9.

The light source device 55 related to the eighth embodiment differs from the seventh embodiment in that Peltier elements 52a, 52b, 52c, 52d, and 52e are provided for each region P, Q, R, S, and T of the wavelength conversion element 51 instead of the Peltier element 52 and the temperature sensors 53a, 53b, 53c, 53d, and 53e, and the use of the wavelength selective element 12 of the fourth embodiment.

All other points are the same as the seventh embodiment, including the descriptive examples.

Peltier elements (temperature variation sections) 52a, 52b, 52c, 52d, and 52e are installed at a predetermined spacing in each of the regions P, Q, R, S, and T on the surface 51b in the wavelength conversion element 51 of the eighth embodiment, as shown in FIG. 9.

Insulating member may be provided between the adjacent Peltier elements 52a, 52b, 52c, 52d, and 52e so that heat is not transmitted between the adjacent regions.

With these Peltier elements 52a, 52b, 52c, 52d, and 52e, the temperature is can be controlled so as to vary the temperature of each the regions P, Q, R, S, and T.

As shown in FIG. 5A, the wavelength conversion element 51 was controlled in the seventh embodiment such that the selective wavelengths λ1, λ2, λ3, λ4, and λ5 in the wavelength conversion element 51 became successively smaller when proceeding from region P toward region T.

As shown in FIG. 5B, the wavelength conversion element 51 can be controlled in the eighth embodiment such that the conversion wavelengths λ1, λ2, λ3, λ4, and λ5 become an intermittent wavelength distribution (random wavelength distribution).

Thus, in the eighth embodiment, for example, elements in which peak wavelengths λ1, λ2, λ3, λ4, and λ5 of light emitted from the light emitting elements 41a, 41b, 41c, 41d, and 41e are 630 nm, 626 nm, 627 nm, 629 nm, and 628 nm, respectively, are used because of manufacturing errors.

At this stage, thermal expansion occurs and the refractive index of each region from P, Q, R, S, and T changes by controlling the temperature of the regions P, Q, R, S, and T of the wavelength conversion element 51 by the Peltier elements 52a, 52b, 52c, 52d, and 52e.

The temperature in each of the regions P, Q, R, S, and T is controlled such that the conversion wavelengths λ1, λ2, λ3, λ4, and λ5 in each of the regions A, B, C, D, and E become 630 nm, 626 nm, 627 nm, 629 nm, and 628 nm, respectively.

In the light source device 55 related to the eighth embodiment also, the speckle noise can be reduced similar to the light source device of the seventh embodiment.

Moreover, in the eighth embodiment, the degree of freedom of the output wavelength distribution emitted from the wavelength conversion element 51 can be enhanced because Peltier elements 52a, 52b, 52c, 52d, and 52e have been installed to the regions P, Q, R, S, and T, respectively.

Accordingly, the wavelength of light emitted from light emitting elements 41a, 41b, 41c, 41d, and 41e and the corresponding wavelength of light that converts each of the regions P, Q, R, S, and T of the wavelength conversion element 51 can be aligned.

As a result, even if variation exists in the output wavelength due to manufacturing errors and so on in the light emitting elements 41a, 41b, 41c, 41d, and 41e, the light utilization efficiency of light emitted from the wavelength conversion element 51 can be enhanced.

Furthermore, since the selective wavelength can be changed in each of the regions A, B, C, D, and E for the wavelength selective element also, the wavelengths corresponding to the wavelength conversion element 51 and the wavelength selective element 12 can also be aligned.

As a result, the light utilization efficiency can be enhanced.

Furthermore, since Peltier elements 52a, 52b, 52c, 52d, and 52e have been provided for each of the regions P, Q, R, S, and T, the difference in the selective wavelengths for the regions P, Q, R, S, and T can be increased or decreased regardless of the figure of 1 nm. Thus, the speckle noise can be reduced more efficiently.

Instead of the Peltier elements 52a, 52b, 52c, 52d, and 52e, and heat emitting elements (temperature variation sections, such as electrically heated wire) or piezoelectric elements (strain application sections) may be used.

With this configuration also, each region from P, Q, R, S, and T can be individually controlled similar to the case in which they are used in the wavelength selective element 12, therefore, the domain pitch of each region from P, Q, R, S, and T may be changed and the conversion wavelength can be changed.

Moreover, similar to the wavelength selective element shown in FIG. 6 of the fifth embodiment, heat absorbing film may be provided in each region from P, Q, R, S, and T of the surface 51b of the wavelength conversion element 51.

With this configuration also, the length of time for which the laser light emits on the heat absorbing film is adjusted similar to the fifth embodiment.

As a result, the domain pitch changes due to thermal expansion since the temperature of each region from P, Q, R, S, and T changes in the wavelength conversion element 51.

Consequently, the light utilization efficiency can be enhanced by matching the domain pitch of the wavelength conversion element 51 with the output wavelength of the light emitting elements 41a, 41b, 41c, 41d, and 41e.

Furthermore, the temperature may be controlled using a Peltier element for a plurality of light selective regions P, Q, R, S, and T of the wavelength conversion element 51, that is, by taking, for example, two regions together.

In this configuration also, the temperature may be controlled such that the wavelengths of light selected by the light selective regions P, Q, R, S, and T are mutually different.

Moreover, in this embodiment, the wavelength selective element 12 shown in the fourth embodiment was used, but the wavelength selective elements shown in the first, the second, the third, and the fifth embodiments may be used.

Ninth Embodiment

Figure 10:
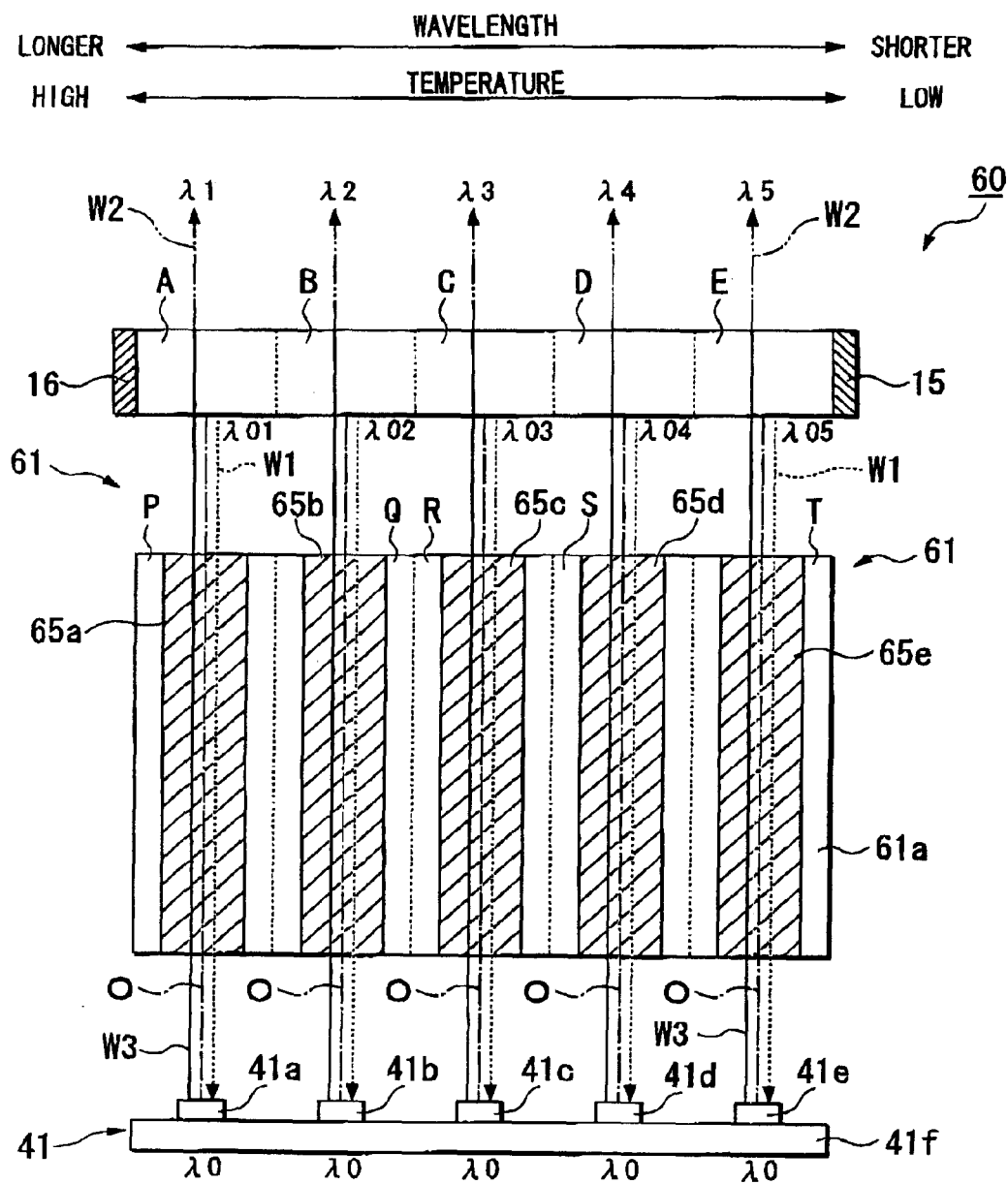
FIG. 10 is a plan view of the light source device related to a ninth embodiment of the invention.

Next, the ninth embodiment related to the invention is described hereafter referring to FIG. 10.

The light source device 60 related to the ninth embodiment differs from the seventh embodiment in that electrodes (voltage application sections) 65a, 65b, 65c, 65d, and 65e are provided on the surface 61a including regions P, Q, R, S, and T of the wavelength conversion element 61 instead of the Peltier element 52a, 52b, 52c, 52d, and 52e.

All other points are the same as the seventh embodiment, including the descriptive examples and examples of modification.

In the wavelength conversion element 61 of the ninth embodiment, electrodes in sheet form 65a, 65b, 65c, 65d, and 65e are provided in the regions P, Q, R, S, and T on the surface 61a such that the a specified spacing is maintained with the adjacent electrodes.

The voltage is applied to each of these electrodes 65a, 65b, 65c, 65d, and 65e so that the voltage of each electrodes 65a, 65b, 65c, 65d, and 65e are different from each other. Thereby, the temperature in each of these regions is different according to the voltage applied.

The refractive index in each of the regions P, Q, R, S, and T of the wavelength conversion element 61 varies according to this temperature difference, and the domain pitch changes due to the thermal expansion.

The voltage applied to the electrodes 65a, 65b, 65c, 65d, and 65e is controlled such that the temperature reduces gradually on going from region P to region T, similar to the seventh embodiment.

Only electrodes 65a, 65b, 65c, 65d, and 65e formed on the surface 61a are shown in FIG. 10, but on the surface on the opposite side of the surface 61a, five electrodes are formed corresponding to the electrodes 65a, 65b, 65c, 65d, and 65e. The regions P, Q, R, S, and T are sandwiched between these pairs of electrodes, and specified voltage is applied on each of the regions P, Q, R, S, and T.

In the light source device 60 related to the ninth embodiment also, effects similar to the light source device of the seventh embodiment can be obtained.

Moreover, in the light source device 60 related to the ninth embodiment, a different voltage can be applied to each of the regions P, Q, R, S, and T. Therefore, accurate controls for conversion characteristics can be performed for each region.

Also, the domain pitch of the regions P, Q, R, S, and T corresponding to the output wavelengths can be changed when the wavelengths of light emitted from the light emitting elements 41a, 41b, 41c, 41d, and 41e are different since the domain pitch can be changed according to regions P, Q, R, S, and T of the wavelength conversion element 61.

As a result, the light utilization efficiency in the wavelength conversion element can be enhanced.

Tenth Embodiment

Figure 11:
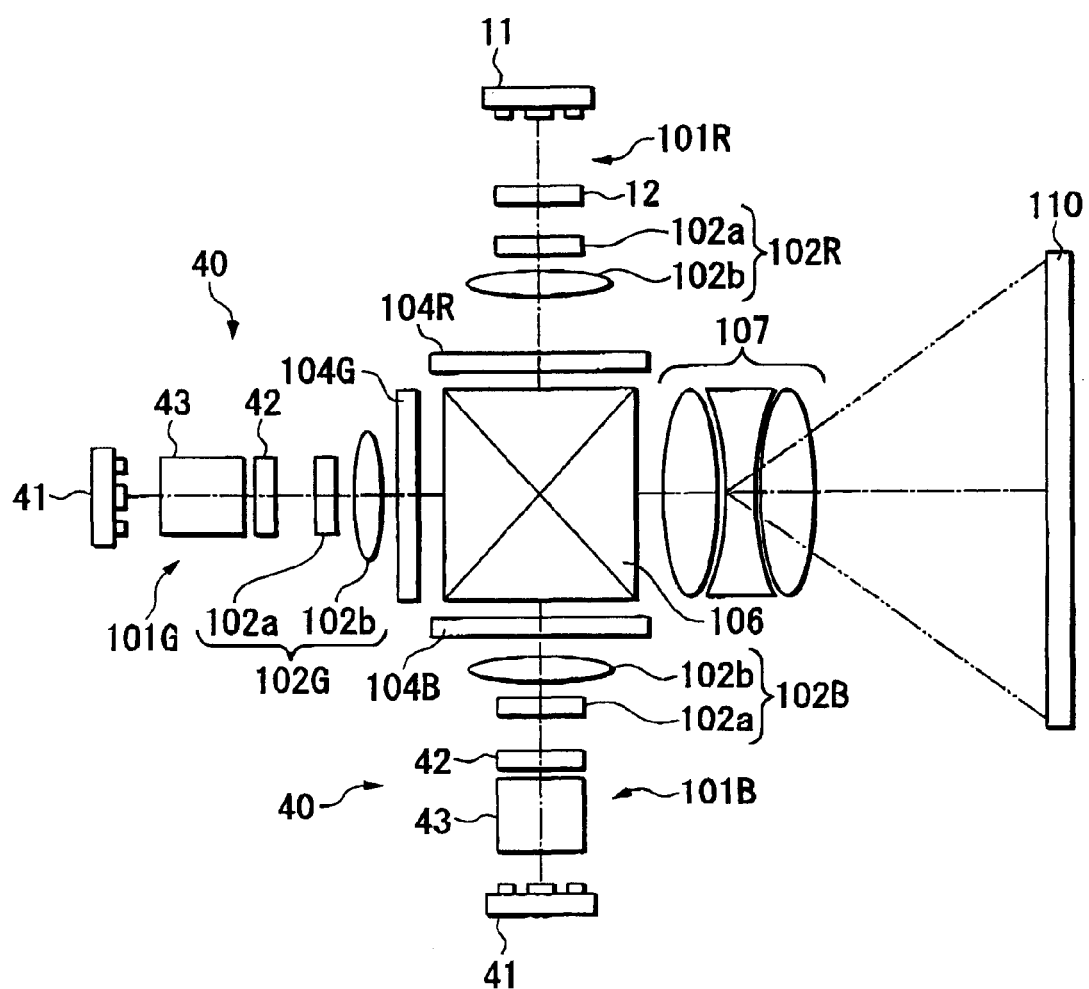
FIG. 11 is a plan view of an image display device related to a tenth embodiment of the invention.

Next, the tenth embodiment related to the invention is described hereafter referring to FIG. 11.

The image display device 100 provided in the light source device 10 of the first embodiment mentioned above, is described hereafter.

The case which is a portion of the image display device 100 is omitted in FIG. 11 for simplicity.

In the image display device 100, the light source device 10 of the first embodiment mentioned above is used as the red laser light source (light source device) 101R that emits red light, and the light source device 40 of the sixth embodiment mentioned above is used as the green laser light source (light source device) 101G that emits green light and blue light, and as the blue laser light source (light source device) 101B.

The image display device 100 includes liquid crystal light valves (light modulating device) 104R, 104G, 104B, a cross dichroic prism (colored light synthesizing device) 106, and a projection lens (projection device) 107.

The liquid crystal light valves 104R, 104G, 104B modulate the laser light emitted from each of the laser light sources 101R, 101G, and 101B. The cross dichroic prism 106 synthesizes and leads the light emitted from the liquid crystal light valves 104R, 104G and 104B to a projection lens 107. The projection lens 107 projects the images formed by the liquid crystal light valves 104R, 104G, and 104B on a screen 110.

Also, in the image display device 100, in order to uniformize the luminance distribution of laser light emitted from the laser light sources 101R, 101G, 101B, uniformizing optical systems 102R, 102G, 102B are installed more downstream side of the light path than the laser light sources 101R, 101G, and 101B. The liquid crystal light valves 104R, 104G and 104B are illuminated by the light with uniformized luminance distribution.

For example, the uniformizing optical systems 102R, 102G, and 102B may be made of hologram 102a and field lens 103b.

Light in three colors modulated by each of the liquid crystal light valves 104R, 104G and 104B are made incident onto the cross dichroic prism 106.

This cross dichroic prism 106 is formed by affixing together four rectangular prisms. On its inner surface, dielectric multilayered film that reflects red colored light and dielectric multilayered film that reflects blue colored light are disposed in a cross shape.

Light of three colors are synthesized by these dielectric multilayered films, and light expressing colored images is formed.

Moreover, the synthesized light is projected on the screen 110 by the projection lens 107, which is the projection optical system, and an enlarged image is displayed.

In the image display device 100 of the tenth embodiment, the light emitted from the red laser light source 101R, the green laser light source 101G, and the blue laser light source 101B is light with reduced coherence. Thus, the projected light from the projection lens 107 is light with suppressed speckle noise.

Accordingly, a satisfactory image can be displayed on the screen 110.

The green and blue laser light sources 101G and 101B in the image display device of the tenth embodiment has been described as using the light source device 40 of the sixth embodiment, but light source device of other embodiments may also be used.

At this stage, light source device of different embodiments may be used in each of the light source device 101R, 101G, and 101B respectively, or light device of the same embodiment may be used.

Transmissive-type liquid crystal light valve was used as the light modulating device, but light valves other than liquid crystal type may also be used, and reflective-type light valves may also be used.

Examples of these light valves are reflective type liquid crystal light valves and digital micro-mirror devices.

The configuration of the projection optical system may be appropriately changed to suite the type of light valves used.

The light source device 10 to 80 of the first to the sixth embodiments may also be used in scanning type image display device.

Figure 12:
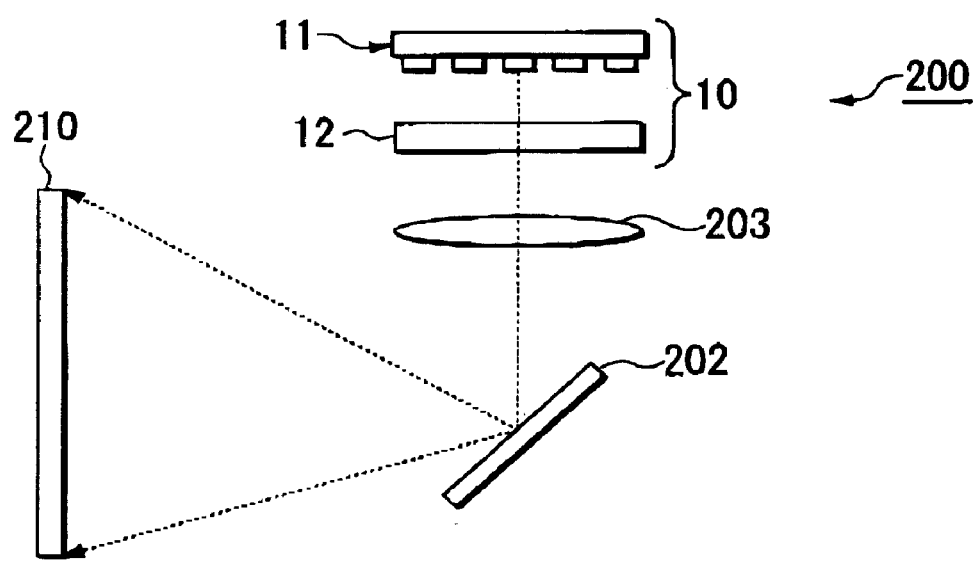
FIG. 12 is a plan view of examples of modification of the image display device of the invention.

An example of such an image display device is shown in FIG. 12.

The image display device 200 shown in FIG. 12 includes the light source device 10 of the first embodiment, an MEMS mirror (scanning section) 202 that scans light emitted from the light source device 10 onto the direction of the screen 210, and a condenser lens 203 that concentrates the light emitted from the light source device 10 onto the MEMS mirror 202.

By moving the MEMS mirror 202, the light emitted from the light source device 10 is led so as to scan in the horizontal and vertical directions on the screen 210.

To display color images, the plurality of light emitting elements that constitute the light emitting section 11 may be formed by a combination of light emitting elements having red, green and blue peak wavelengths.

Note that the scope of the skill of the invention is not limited to the embodiment mentioned above, and various changes may be effected to the invention without departing from the spirit and scope of the invention.

For example in the sixth, the seventh and the ninth embodiments, wavelength selective element 42 provided with a construction similar to the first embodiment was used, but instead, the wavelength selective element provided with a construction similar to the second, the third the fourth and the fifth embodiments may be used.

The wavelength selective elements 12, 33, and 42 may have different selective wavelengths for each light selective region. They need not reduce sequentially as mentioned above.

Also, the same holds good for the wavelength conversion element 43, 51, and 61.

Short surface emitting laser or surface emitting laser may be used for the light emitting element.

What is claimed is:

1. A light source device comprising:
a plurality of light emitting elements that emit laser light;
a wavelength conversion element that includes
a light pass-through region through which the laser light emitted from one of the light emitting elements passes, which converts light of the wavelength included in the laser light into light of a predetermined wavelength, and which emits the light having been converted into the predetermined wavelength and light having not been converted into the predetermined wavelength, and
that is constituted by a plurality of the light pass-through regions so that the wavelengths of the light converted by the light pass-through regions are different from each other;
a wavelength selective element that includes
a light selective region into which the light having been converted into the predetermined wavelengths and the light having not been converted into the predetermined wavelengths are incident, functioning as a resonator mirror of the light emitting element by selecting the light having not been converted into the predetermined wavelengths and reflecting the light having not been converted into the predetermined wavelengths toward the light emitting element while allowing the remaining laser light to pass therethrough, and
a base member having a plurality of the light selective regions so that the wavelengths of the light selected by the light selective regions are different from each other; and
a temperature variation section that varies the temperature of each light selective region and that varies the wavelengths of light selected by each light selective region.

2. The light source device according to claim 1, wherein the wavelength conversion element has a domain-repetitive structure in which polarization is repetitively reversed along the central axis of laser light emitted from the light emitting elements, and a width in the direction of the central axis of the laser light of the domain is equal in all the light pass-through regions.

3. The light source device according to claim 1, wherein the temperature variation sections are installed in the light selective regions, respectively.

4. The light source device according to claim 1, wherein a peak wavelength of light emitted from at least one of the light emitting elements is identical to a peak wavelength of light selected in the light selective region corresponding to the light selective region.

5. An image display device comprising:
the light source device according to claim 1;
a light modulating device that modulates light emitted from the light source device in accordance with image signal; and
a projection device that projects images formed by the light modulating device.

6. An image display device comprising:
the light source device according to claim 1; and
a scanning section that scans the laser light emitted from the light source device on a projection surface.

* * * * *